US012566212B2

(12) United States Patent
Sung et al.

(10) Patent No.: US 12,566,212 B2
(45) Date of Patent: Mar. 3, 2026

(54) POWER EFFICIENT REGISTER FILES FOR DEEP NEURAL NETWORK (DNN) ACCELERATOR

(71) Applicant: Intel Corporation, Santa Clara, CA (US)

(72) Inventors: Raymond Jit-Hung Sung, San Francisco, CA (US); Deepak Abraham Mathaikutty, Chandler, AZ (US); Amit Agarwal, Hillsboro, OR (US); David Thomas Bernard, Kilcullen (IE); Steven Hsu, Lake Osego, OR (US); Martin Power, Dublin (IE); Conor Byrne, Dublin (IE); Arnab Raha, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 650 days.

(21) Appl. No.: 17/934,665

(22) Filed: Sep. 23, 2022

(65) Prior Publication Data

US 2023/0014656 A1     Jan. 19, 2023

(51) Int. Cl.
*G01R 31/3177*     (2006.01)
*G06N 3/04*     (2023.01)

(52) U.S. Cl.
CPC ........... *G01R 31/3177* (2013.01); *G06N 3/04* (2013.01)

(58) Field of Classification Search
CPC ...... G01R 31/3177; G06N 3/04; G06N 3/084; G06N 3/0464; G06N 3/063; G06F 15/167; G11C 11/54
See application file for complete search history.

(56) References Cited

U.S. PATENT DOCUMENTS

2004/0139289 A1*     7/2004     Yoshida .................. G06F 11/00
714/E11.018
2012/0198294 A1*     8/2012     Nadeau-Dostie ...... G11C 29/32
714/719
(Continued)

FOREIGN PATENT DOCUMENTS

EP          2515226 A1     10/2012

OTHER PUBLICATIONS

Bhutada et al., Complex Clock Gating with Integrated Clock Gating Logic Cell, 1-4244-1278-1/07 (c) 2007 IEEE, 6 pages.
(Continued)

*Primary Examiner* — Thien Nguyen
(74) *Attorney, Agent, or Firm* — Akona IP PC

(57)     ABSTRACT

A memory array of a compute tile may store activations or weights of a DNN. The memory array may include data-banks for storing contexts, context MUXs, and byte MUXs. A databank may store a context with flip-flop arrays, each of which includes a sequence of flip-flops. A logic gate and an ICG unit may gate flip-flops and control whether states of the flip-flops can be changed. The data gating can prevent a context not selected for the databank from inadvertently toggling and wasting power A context MUX may read a context from different flip-flop arrays in a databank based on gray-coded addresses. A byte MUX can combine bits from different bytes in a context read by the context MUX. The memory array may be implemented with bit packing to reduce distance between the context MUX and byte MUX to reduce lengths of wires connecting the context MUXs and byte MUXs.

25 Claims, 15 Drawing Sheets

(56) References Cited

U.S. PATENT DOCUMENTS

| | | |
|---|---|---|
| 2022/0261623 A1 | 8/2022 | Sung et al. |
| 2024/0223919 A1* | 7/2024 | Chen ..................... H04N 25/77 |

OTHER PUBLICATIONS

Jang, Jun-Woo et al "Sparsity Aware and re-configurable NPU architecture for Samsung Flagship Mobile SoC", 2021 ACM/IEEE 48th Annual International Symposium on Computer Architecture (ISCA) (2021): 15-28.

Power, Martin et al. "VPU2.7—Intel's 1st Integrated Neural Compute Engine for Client Socs", DTTC 2021.

Sze, Vivienne et al "Efficient Processing of Deep Neural Networks: A Tutorial and Survey", retrieved from https://doi.org/10.48550/arXiv.1703.0903 on Sep. 16, 2022, 32 pages.

* cited by examiner

DNN 100

Convolutional Layer 110

Pooling Layer 120

Fully Connected Layer 130

Input Image 105

Object 115

Object 125

Object 135

| 0 | 1 | 2 | 3 | 4 | 5 | 6 | 7 | 8 | 9 | 10 | 11 | 12 | 13 | 14 | 15 |
|---|---|---|---|---|---|---|---|---|---|----|----|----|----|----|----|
| 0000 | 0001 | 0010 | 0011 | 0100 | 0101 | 0110 | 0111 | 1000 | 1001 | 1010 | 1011 | 1100 | 1101 | 1110 | 1111 |

FIG. 8A

| 0 | 1 | 3 | 2 | 6 | 7 | 5 | 4 | 12 | 13 | 15 | 14 | 10 | 11 | 9 | 8 |
|---|---|---|---|---|---|---|---|----|----|----|----|----|----|---|---|
| 0000 | 0001 | 0011 | 0010 | 0110 | 0111 | 0101 | 0100 | 1100 | 1101 | 1111 | 1110 | 1010 | 1011 | 1001 | 1000 |

FIG. 8B

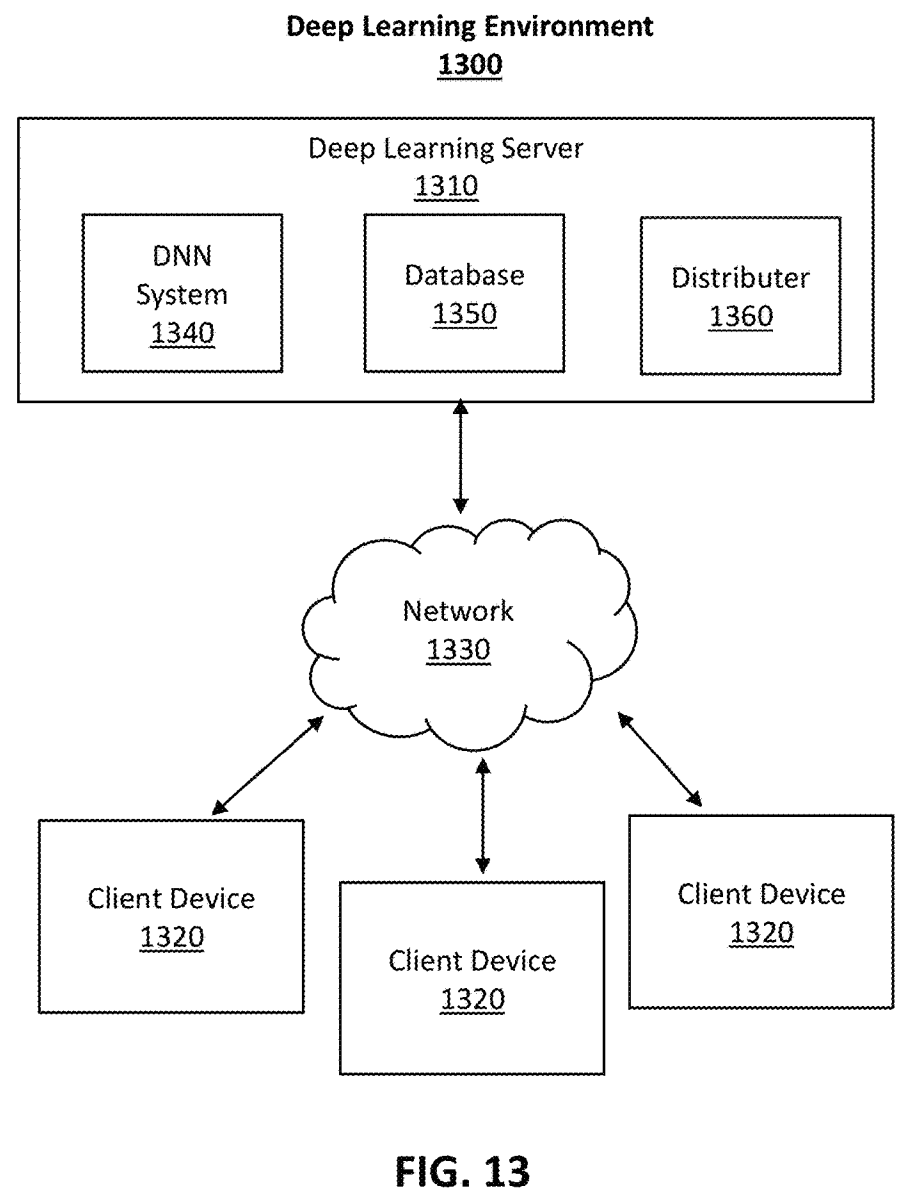

Deep Learning Environment
1300

Deep Learning Server
1310

DNN System 1340

Database 1350

Distributer 1360

Network 1330

Client Device 1320

Client Device 1320

Client Device 1320

FIG. 13

POWER EFFICIENT REGISTER FILES FOR DEEP NEURAL NETWORK (DNN) ACCELERATOR

TECHNICAL FIELD

This disclosure relates generally to neural networks, and more specifically, to power efficient register files for DNN accelerators.

BACKGROUND

DNNs are used extensively for a variety of artificial intelligence applications ranging from computer vision to speech recognition and natural language processing due to their ability to achieve high accuracy. However, the high accuracy comes at the expense of significant computation cost. DNNs have extremely high computing demands as each inference can require hundreds of millions of MAC (multiply-accumulate) operations as well as hundreds of millions of weight operand weights to be stored for classification or detection. Therefore, techniques to improve efficiency of DNNs are needed.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIG. 8A illustrates sequential binary addressing, in accordance with various embodiments.

FIG. 8B illustrates sequential gray addressing, in accordance with various embodiments.

FIG. 13 illustrates a deep learning environment, in accordance with various embodiments.

DETAILED DESCRIPTION

Overview

Figure 1:
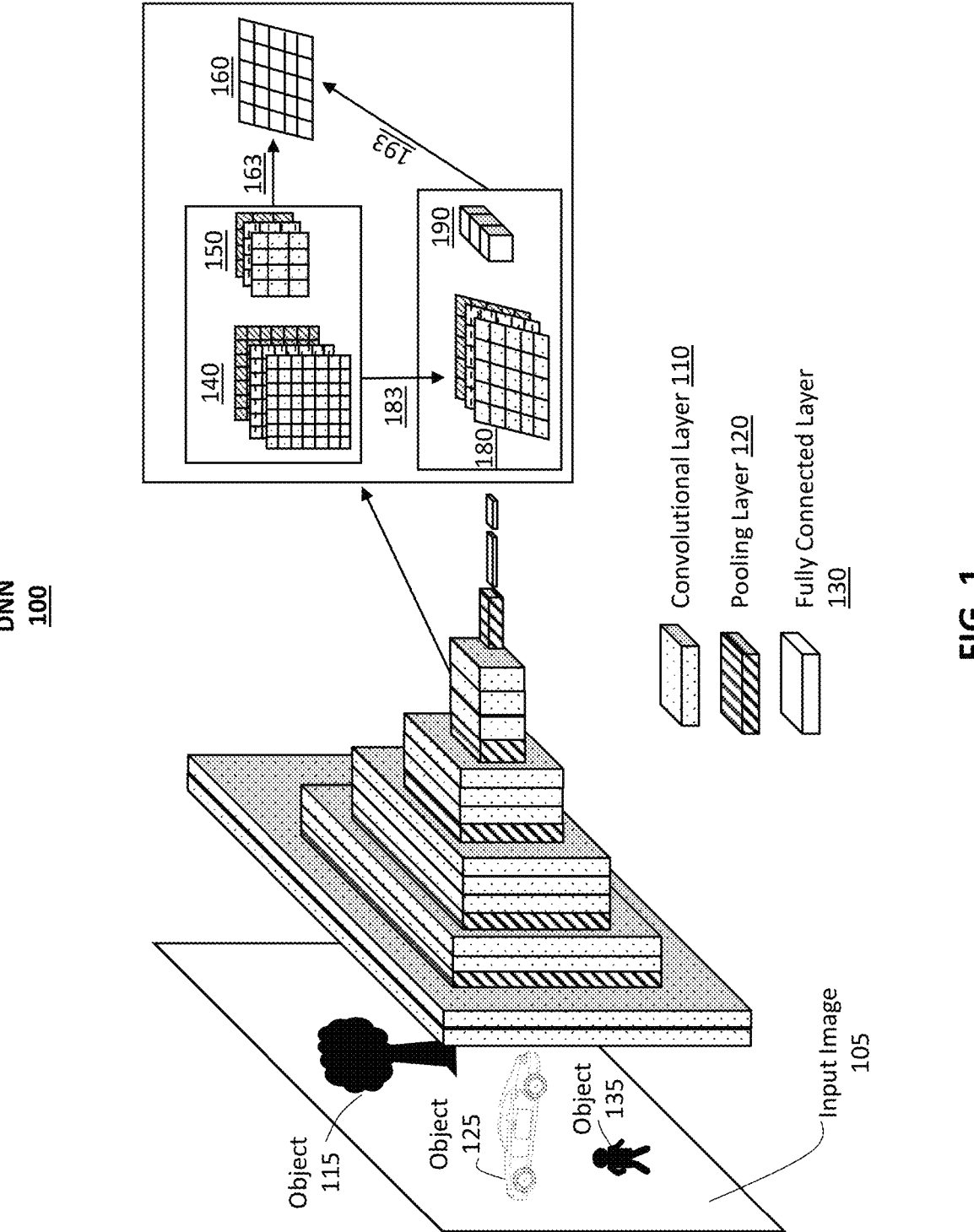
FIG. 1 illustrates an example DNN, in accordance with various embodiments.

The last decade has witnessed a rapid rise in AI (artificial intelligence) based data processing, particularly based on DNN. DNNs are widely used in the domains of computer vision, speech recognition, image, and video processing mainly due to their ability to achieve beyond human-level accuracy. The significant improvements in DNN model size and accuracy coupled with the rapid increase in computing power of execution platforms have led to the adoption of DNN applications even within resource constrained mobile and edge devices that have limited energy availability.

Accelerating DNNs on edge devices have become ubiquitous in mobile applications. However, on-device inference has strict latency requirements while being able to operate within a highly constrained power envelope. A DNN accelerator often includes an array of PEs capable of doing MAC operations using local data paths consisting of register files, multipliers, and accumulators. There exists a "Load Path" for retrieving the weights and activations from a memory and distributing it to the register files within each PE. The Load is generally implemented as a Network-On-Chip (NOC) which allows it to broadcast, multi-cast or uni-cast the input data to different PEs with the goal of reusing as many of the inputs as possible depending on the layer in the DNN. The "Drain Path", which may also be implemented as a NOC, is used to retrieve the output feature maps for each layer, running them through post-processing operations such as biasing and rounding and eventually compressing the results before writing them back to memory.

Data movement is a significant power cost in DNN accelerators. To reduce overall data movement, local register files are often used. However, the register files are a substantial source of power dissipation themselves and can account for nearly half of the total consumed power. Thus, reducing register file power is important to reducing the power of the entire accelerator. Many DNN accelerators use dynamic full-swing register files as the local storage. To amortize the cost of narrow data widths, multiple 8-bit entries might be grouped together into a single entry, e.g., 64 bits. After the entire entry is written, multiple read ports will access the entries, and an output multiplexer will select the proper bytes as input to the MACs. Some DNN accelerators may use standard cell memory arrays as their local storage. However, power optimizations, especially related as how they might be used in a DNN accelerator, are typically not addressed.

Also, using a dynamic register file as local storage is inefficient in terms of both area and power. One reason for the low power efficiency is that decoders are often activated to select entries where only a small portion of the entry is used. Also, merging multiple entries into a single entry can cause wasted power when reading the entire entry as only a subset of bytes in the entry are used for computation. Furthermore, dynamic register files cannot write all entries at once as is often required for DNN accelerators to not stall computation. A solution to this is to have two copies of the dynamic register file, where one is being written while the other one is being read. However, this solution would require extra area. Therefore, improved technology for register files in DNN accelerators is needed.

Embodiments of the present disclosure may improve on at least some of the challenges and issues described above by providing an DNN accelerator that includes power efficient register files. An example DNN accelerator includes a PE array and a plurality of memory arrays coupled to the PE array. The PE array performs deep learning operations in a DNN. Learning operations may include convolution, pooling operation, elementwise operation (e.g., elementwise addition, elementwise multiplication, etc.), loading, reducing, other types of deep learning operations in the DNN, or some combination thereof. The memory array may include an input memory array for storing activations used by the PE array for deep learning operations, a weight memory array for storing weights used by the PE array for deep learning operations, and an output memory array for storing outputs produced by the PE array from deep learning operations. A layout of a memory array may be the same as or similar to a layout of the PE array.

A memory array may include a plurality of register files, first-level MUXs (multiplexers), and second-level MUXs. A register file may also be referred to as a databank. A databank includes flip-flops for storing data. In an example, a databank may include a series of flip-flop arrays, each of which can store a byte. The databank may have a capacity for storing a context. The context is a vector in an input tensor or filter and includes a sequence of data points. The data points may be activations or weights. Each data point may be for a different channel. The number of flip-flop arrays in a databank may be equal to or more than the number of bytes in the context. Each flip-flop may be gated by an ICG (integrated clock gating) unit so that a context selected for a databank is written into the databank and not into the other databanks. As multiple bits can be written at a time, unselected contexts may experience spurious transitions. The logic gate that implements data gating on unselected flip-flops can suppress such spurious transitions, e.g., through latches in the flip-flops, to support parallel data load. For instance, the ICG and logic gate for a flip-flop can prevent changes in a state of the flip-flop for unselected contexts. In embodiments where the memory array is used for output data, it may receive even more spurious transitions from unselected contexts since there are even more contexts than for the input register file case. The data gating can reduce even more power than for the input register file case.

A first-level MUX can read bytes in the context from some or all of the flip-flop arrays in the databank. A second-level MUX can read bits from the bytes read by the first-level MUX. A first-level MUX or second-level MUX can read data with a sequence of addresses determined based on gray codes. With gray coding, two adjacent addresses in the sequence are different by a single bit, and the other bits in the addresses may be the same. This can reduce read address transitions and read data transitions. The power for reading data (e.g., dense data) can therefore be reduced by apply gray codes. A second-level MUX may perform two-stage multiplexing. The second-level MUX may include a first MUX and a second MUX. The first MUX may pre-read bytes based on the least frequently switching bits in addresses. Then the second MUX can further read the bytes based on the most frequently switched bits in addresses. The second MUX can multiplex out the pre-dead data with the least power. Further, bits to be written into a databank can be packed in a way that a flip-flop array stores bits from different bytes, and these bits may have the same position in the bytes. This can reduce distance between the first-level MUX and the second-level MUX and thereby reduce area and power needed for reading data.

For purposes of explanation, specific numbers, materials and configurations are set forth in order to provide a thorough understanding of the illustrative implementations. However, it will be apparent to one skilled in the art that the present disclosure may be practiced without the specific details or/and that the present disclosure may be practiced with only some of the described aspects. In other instances, well known features are omitted or simplified in order not to obscure the illustrative implementations.

Further, references are made to the accompanying drawings that form a part hereof, and in which is shown, by way of illustration, embodiments that may be practiced. It is to be understood that other embodiments may be utilized, and structural or logical changes may be made without departing from the scope of the present disclosure. Therefore, the following detailed description is not to be taken in a limiting sense.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges.

The description uses the phrases "in an embodiment" or "in embodiments," which may each refer to one or more of the same or different embodiments. The terms "comprising," "including," "having," and the like, as used with respect to embodiments of the present disclosure, are synonymous. The disclosure may use perspective-based descriptions such as "above," "below," "top," "bottom," and "side" to explain various features of the drawings, but these terms are simply for ease of discussion, and do not imply a desired or required orientation. The accompanying drawings are not necessarily drawn to scale. Unless otherwise specified, the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

In the following detailed description, various aspects of the illustrative implementations will be described using terms commonly employed by those skilled in the art to convey the substance of their work to others skilled in the art.

The terms "substantially," "close," "approximately," "near," and "about," generally refer to being within +/−20% of a target value based on the input operand of a particular value as described herein or as known in the art. Similarly, terms indicating orientation of various elements, e.g., "coplanar," "perpendicular," "orthogonal," "parallel," or any other angle between the elements, generally refer to being within +/−5-20% of a target value based on the input operand of a particular value as described herein or as known in the art.

In addition, the terms "comprise," "comprising," "include," "including," "have," "having" or any other variation thereof, are intended to cover a non-exclusive inclusion. For example, a method, process, device, or DNN accelerator that comprises a list of elements is not necessarily limited to only those elements but may include other elements not expressly listed or inherent to such method, process, device, or DNN accelerators. Also, the term "or" refers to an inclusive "or" and not to an exclusive "or."

The DNN systems, methods and devices of this disclosure each have several innovative aspects, no single one of which is solely responsible for all desirable attributes disclosed herein. Details of one or more implementations of the subject matter described in this specification are set forth in the description below and the accompanying drawings.

Example DNN

FIG. 1 illustrates an example DNN 100, in accordance with various embodiments. For purpose of illustration, the DNN 100 in FIG. 1 is a convolutional neural network (CNN). In other embodiments, the DNN 100 may be other types of DNNs. The DNN 100 is trained to receive images and output classifications of objects in the images. In the embodiments of FIG. 1, the DNN 100 receives an input image 105 that includes objects 115, 125, and 135. The DNN 100 includes a sequence of layers comprising a plurality of convolutional layers 110 (individually referred to as "convolutional layer 110"), a plurality of pooling layers 120 (individually referred to as "pooling layer 120"), and a plurality of fully connected layers 130 (individually referred to as "fully connected layer 130"). In other embodiments, the DNN 100 may include fewer, more, or different layers. In an inference of the DNN 100, the layers of the DNN 100 execute tensor computation that includes many tensor operations, such as convolution (e.g., multiply-accumulate (MAC) operations, etc.), pooling operations, elementwise operations (e.g., elementwise addition, elementwise multiplication, etc.), other types of tensor operations, or some combination thereof.

The convolutional layers 110 summarize the presence of features in the input image 105. The convolutional layers 110 function as feature extractors. The first layer of the DNN 100 is a convolutional layer 110. In an example, a convolutional layer 110 performs a convolution on an input tensor 140 (also referred to as input feature map (IFM) 140) and a filter 150. As shown in FIG. 1, the IFM 140 is represented by a 7×7×3 three-dimensional (3D) matrix. The IFM 140 includes 3 input channels, each of which is represented by a 7×7 two-dimensional (2D) array. The 7×7 2D array includes 7 input elements (also referred to as input points) in each row and 7 input elements in each column. The filter 150 is represented by a 3×3×3 3D matrix. The filter 150 includes 3 kernels, each of which may correspond to a different input channel of the IFM 140. A kernel a 2D array of weights, where the weights are arranged in columns and rows. A kernel can be smaller than the IFM. In the embodiments of FIG. 1, each kernel is represented by a 3×3 2D array. The 3×3 kernel includes 3 weights in each row and 3 weights in each column. Weights can be initialized and updated by backpropagation using gradient descent. The magnitudes of the weights can indicate importance of the filter 150 in extracting features from the IFM 140.

The convolution includes MAC operations with the input elements in the IFM 140 and the weights in the filter 150. The convolution may be a standard convolution 163 or a depthwise convolution 183. In the standard convolution 163, the whole filter 150 slides across the IFM 140. All the input channels are combined to produce an output tensor 160 (also referred to as output feature map (OFM) 160). The OFM 160 is represented by a 5×5 2D array. The 5×5 2D array includes 5 output elements (also referred to as output points) in each row and 5 output elements in each column. For purpose of illustration, the standard convolution includes one filter in the embodiments of FIG. 1. In embodiments where there are multiple filters, the standard convolution may produce multiple output channels in the OFM 160.

The multiplication applied between a kernel-sized patch of the IFM 140 and a kernel may be a dot product. A dot product is the elementwise multiplication between the kernel-sized patch of the IFM 140 and the corresponding kernel, which is then summed, always resulting in a single value. Because it results in a single value, the operation is often referred to as the "scalar product." Using a kernel smaller than the IFM 140 is intentional as it allows the same kernel (set of weights) to be multiplied by the IFM 140 multiple times at different points on the IFM 140. Specifically, the kernel is applied systematically to each overlapping part or kernel-sized patch of the IFM 140, left to right, top to bottom. The result from multiplying the kernel with the IFM 140 one time is a single value. As the kernel is applied multiple times to the IFM 140, the multiplication result is a 2D array of output elements. As such, the 2D output array (i.e., the OFM 160) from the standard convolution 163 is referred to an OFM.

In the depthwise convolution 183, the input channels are not combined. Rather, MAC operations are performed on an individual input channel and an individual kernel and produce an output channel. As shown in FIG. 1, the depthwise convolution 183 produces a depthwise output tensor 180. The depthwise output tensor 180 is represented by a 5×5×3 3D matrix. The depthwise output tensor 180 includes 3 output channels, each of which is represented by a 5×5 2D array. The 5×5 2D array includes 5 output elements in each row and 5 output elements in each column. Each output channel is a result of MAC operations of an input channel of the IFM 140 and a kernel of the filter 150. For instance, the first output channel (patterned with dots) is a result of MAC operations of the first input channel (patterned with dots) and the first kernel (patterned with dots), the second output channel (patterned with horizontal strips) is a result of MAC operations of the second input channel (patterned with horizontal strips) and the second kernel (patterned with horizontal strips), and the third output channel (patterned with diagonal stripes) is a result of MAC operations of the third input channel (patterned with diagonal stripes) and the third kernel (patterned with diagonal stripes). In such a depthwise convolution, the number of input channels equals the number of output channels, and each output channel corresponds to a different input channel. The input channels and output channels are referred to collectively as depthwise channels. After the depthwise convolution, a pointwise convolution 193 is then performed on the depthwise output tensor 180 and a 1×1×3 tensor 190 to produce the OFM 160.

The OFM 160 is then passed to the next layer in the sequence. In some embodiments, the OFM 160 is passed through an activation function. An example activation function is the rectified linear activation function (ReLU). ReLU is a calculation that returns the value provided as input directly, or the value zero if the input is zero or less. The convolutional layer 110 may receive several images as input and calculates the convolution of each of them with each of the kernels. This process can be repeated several times. For instance, the OFM 160 is passed to the subsequent convolutional layer 110 (i.e., the convolutional layer 110 following the convolutional layer 110 generating the OFM 160 in the sequence). The subsequent convolutional layers 110 performs a convolution on the OFM 160 with new kernels and generates a new feature map. The new feature map may also be normalized and resized. The new feature map can be kernelled again by a further subsequent convolutional layer 110, and so on.

In some embodiments, a convolutional layer 110 has 4 hyperparameters: the number of kernels, the size F kernels (e.g., a kernel is of dimensions F×F×D pixels), the S step with which the window corresponding to the kernel is dragged on the image (e.g., a step of one means moving the window one pixel at a time), and the zero-padding P (e.g., adding a black contour of P pixels thickness to the input image of the convolutional layer 110). The convolutional layers 110 may perform various types of convolutions, such as 2-dimensional convolution, dilated or atrous convolution, spatial separable convolution, depthwise separable convolution, transposed convolution, and so on. The DNN 100 includes 16 convolutional layers 110. In other embodiments, the DNN 100 may include a different number of convolutional layers.

The pooling layers 120 down-sample feature maps generated by the convolutional layers, e.g., by summarizing the presents of features in the patches of the feature maps. A pooling layer 120 is placed between 2 convolution layers 110: a preceding convolutional layer 110 (the convolution layer 110 preceding the pooling layer 120 in the sequence of layers) and a subsequent convolutional layer 110 (the convolution layer 110 subsequent to the pooling layer 120 in the sequence of layers). In some embodiments, a pooling layer 120 is added after a convolutional layer 110, e.g., after an activation function (e.g., ReLU) has been applied to the OFM 160.

A pooling layer 120 receives feature maps generated by the preceding convolution layer 110 and applies a pooling operation to the feature maps. The pooling operation reduces the size of the feature maps while preserving their important characteristics. Accordingly, the pooling operation improves the efficiency of the DNN and avoids over-learning. The pooling layers 120 may perform the pooling operation through average pooling (calculating the average value for each patch on the feature map), max pooling (calculating the maximum value for each patch of the feature map), or a combination of both. The size of the pooling operation is smaller than the size of the feature maps. In various embodiments, the pooling operation is 2×2 pixels applied with a stride of 2 pixels, so that the pooling operation reduces the size of a feature map by a factor of 2, e.g., the number of pixels or values in the feature map is reduced to one quarter the size. In an example, a pooling layer 120 applied to a feature map of 6×6 results in an output pooled feature map of 3×3. The output of the pooling layer 120 is inputted into the subsequent convolution layer 110 for further feature extraction. In some embodiments, the pooling layer 120 operates upon each feature map separately to create a new set of the same number of pooled feature maps.

The fully connected layers 130 are the last layers of the DNN. The fully connected layers 130 may be convolutional or not. The fully connected layers 130 receives an input operand. The input operand defines the output of the convolutional layers 110 and pooling layers 120 and includes the values of the last feature map generated by the last pooling layer 120 in the sequence. The fully connected layers 130 applies a linear combination and an activation function to the input operand and generates an individual partial sum. The individual partial sum may contain as many elements as there are classes: element i represents the probability that the image belongs to class i. Each element is therefore between 0 and 1, and the sum of all is worth one. These probabilities are calculated by the last fully connected layer 130 by using a logistic function (binary classification) or a softmax function (multi-class classification) as an activation function.

In some embodiments, the fully connected layers 130 classify the input image 105 and returns an operand of size N, where N is the number of classes in the image classification problem. In the embodiments of FIG. 1, N equals 3, as there are 3 objects 115, 125, and 135 in the input image. Each element of the operand indicates the probability for the input image 105 to belong to a class. To calculate the probabilities, the fully connected layers 130 multiply each input element by weight, makes the sum, and then applies an activation function (e.g., logistic if N=2, softmax if N>2). This is equivalent to multiplying the input operand by the matrix containing the weights. In an example, the individual partial sum includes 3 probabilities: a first probability indicating the object 115 being a tree, a second probability indicating the object 125 being a car, and a third probability indicating the object 135 being a person. In other embodiments where the input image 105 includes different objects or a different number of objects, the individual partial sum can be different.

Example Convolution

Figure 2:
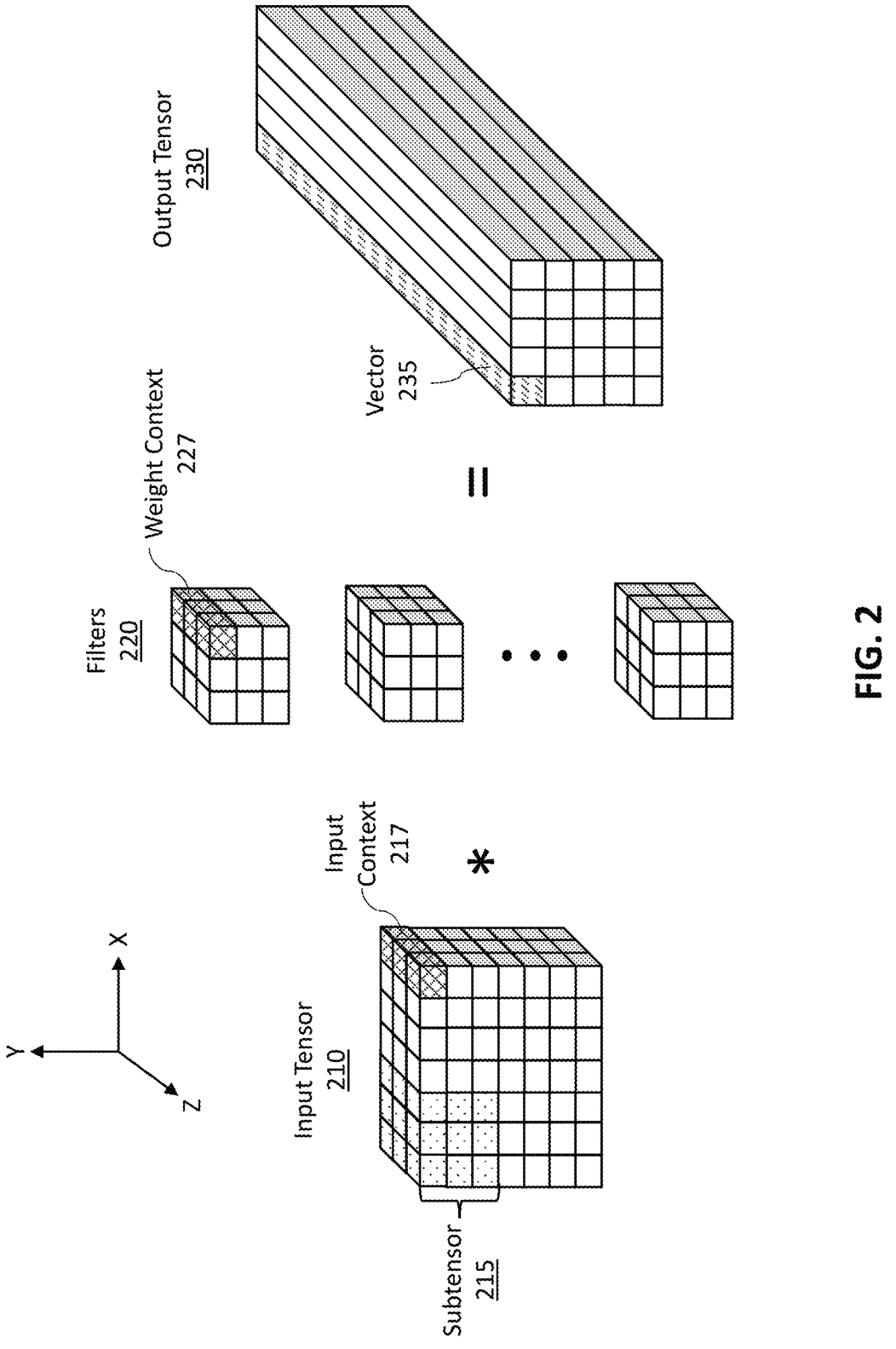
FIG. 2 illustrates an example convolution, in accordance with various embodiments.

FIG. 2 illustrates an example convolution, in accordance with various embodiments. The convolution may be a convolution in a convolutional layer of a DNN, e.g., a convolutional layer 110 in FIG. 1. The convolution can be executed on an input tensor 210 and filters 220 (individually referred to as "filter 210"). A result of the convolution is an output tensor 230. In some embodiments, the convolution is performed by a PE array, such as the PE array 340 in FIG. 3.

In the embodiments of FIG. 2, the input tensor 210 includes activations (also referred to as "input activations," "input elements," or "elements") arranged in a 3D matrix. Each input activation may be represented by a (X, Y, Z) coordinate that indicates a position of the activation in the 3D matrix. The input tensor 210 has a spatial size $H_{in} \times W_{in} \times C_{in}$, where $H_{in}$ is the height of the 3D matrix (i.e., the length along the Y-axis, which indicates the number of activations in a column in the 2D matrix of each input channel), $W_{in}$ is the width of the 3D matrix (i.e., the length along the X-axis, which indicates the number of activations in a row in the 2D matrix of each input channel), and $C_{in}$ is the depth of the 3D matrix (i.e., the length along the Z axis, which indicates the number of input channels). For purpose of simplicity and illustration, the input tensor 210 has a spatial size of 7×7×3, i.e., the input tensor 210 includes three input channels and each input channel has a 7×7 2D matrix.

Each filter 220 includes weights arranged in a 3D matrix. The values of the weights may be determined through training the DNN. A filter 220 has a spatial size $H_f \times W_f \times C_f$, where $H_f$ is the height of the filter (i.e., the length along the Y-axis, which indicates the number of weight in a column in each kernel), $W_f$ is the width of the filter (i.e., the length along the X-axis, which indicates the number of weights in a row in each kernel), and $C_f$ is the depth of the filter (i.e., the length along the Z axis, which indicates the number of channels). In some embodiments, $C_f$ equals $C_{in}$. For purpose of simplicity and illustration, each filter 220 in FIG. 2 has a spatial size of 3×3×3, i.e., the filter 220 includes 3 convolutional kernels with a spatial size of 3×3. The spatial size of the convolutional kernels is smaller than the spatial size of the 2D matrix of each input channel in the input tensor 210.

In the convolution, each filter 220 slides across the input tensor 210 and generates a 2D matrix for an output channel in the output tensor 230. In the embodiments of FIG. 2, 2D matrix has a spatial size of 5×5. The output tensor 230 includes output elements (also referred to as "elements") arranged in a 3D matrix. Each output element in the output tensor may be represented by a (X, Y, Z) coordinate that indicates a position of the input elements in the 3D matrix. The output tensor 230 has a spatial size $H_{out} \times W_{out} \times C_{out}$, where $H_{out}$ is the height of the 3D matrix (i.e., the length along the Y-axis, which indicates the number of activations in a column in the 2D matrix of each output channel), $W_{out}$ is the width of the 3D matrix (i.e., the length along the X-axis, which indicates the number of activations in a row in the 2D matrix of each output channel), and $C_{out}$ is the depth of the 3D matrix (i.e., the length along the Z axis, which indicates the number of output channels). $C_{out}$ may equal the number of filters 220 in the convolution. $H_{out}$ and $W_{out}$ may depend on the heights and weights of the input tensor 210 and each filter 220.

In an example step of the convolution, MAC operations can be performed on a 3×3×3 subtensor 215 (which is highlighted with a dotted pattern in FIG. 2) in the input tensor and all the filters 220. The subtensor 215 has the same spatial size as each filter 220. The result of the MAC operations on the subtensor 215 and one filter 220 is a vector 235 in the output tensor 230. The vector 235 has a spatial size of $1 \times 1 \times C_{out}$. The vector 235 includes a sequence of output elements, which corresponds to different output channels in the output tensor 230.

An individual MAC operation may be performed on an input context 217 and a weight context 227. The input context 217 may include a sequence of activations across all the input channels of the input tensor 210. The activations in the input context 217 may have the same (X, Y) coordinate. The input context 217 has a spatial size of $1 \times 1 \times C_{in}$. The weight context 227 may include a sequence of weight s across all the channels in a filter 220. The weights in the weight context 227 may have the same (X, Y) coordinate. The weight context 227 has a spatial size of $1 \times 1 \times C_{in}$. In some embodiments, the input context 217 and weight context 227 may be provided to a PE, such as a PE 345 in FIG. 3 or PE 410 in FIG. 4. The PE performs the MAC operation on the input context 217 and weight context 227.

The input context 217 may include $C_{in}$ activations. An activation may include one or more bytes. The number of bytes in an activation may be based on the data format of the activation. In an example where the data format is INT8, an activation may include a single byte and the total number of bits in the input context 217 is $8*C_{in}$. In another example where the data format is FP16 or BF16, an activation may include two bytes, and the total number of bits in the input context 217 is $16*C_{in}$. Similarly, the weight context 227 may include $C_{in}$ weights. A weight may include one or more bytes. The number of bytes in an weight may be based on the data format of the activation. In an example where the data format is INT8, a weight may include a single byte and the total number of bits in the weight context 227 is $8*C_{in}$. In another example where the data format is FP16 or BF16, a weight may include two bytes, and the total number of bits in the weight context 227 is $16*C_{in}$. The input context 217 and weight context 227 may be written into registered files associated with the PE and then read by the PE from the register files to perform the MAC operation. The result of the MAC operation can be written into another register file associated with the PE. More details regarding register files are provided below in conjunction with FIGS. 3 and 6-11.

Example Compute Tile

Figure 3:
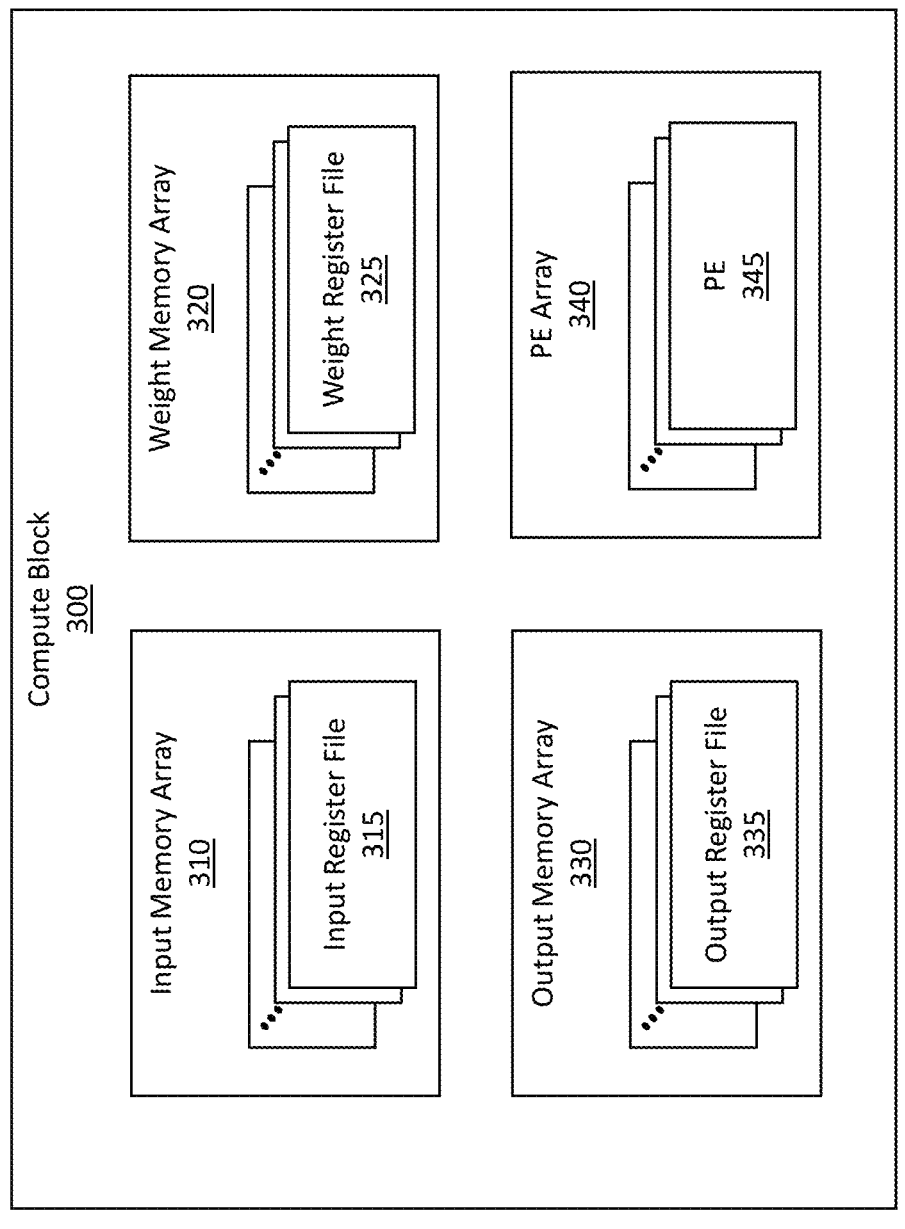
FIG. 3 is a block diagram of a compute block, in accordance with various embodiments.

FIG. 3 is a block diagram of a compute block 300, in accordance with various embodiments. The compute block 300 can execute deep learning operations in a DNN, such as the DNN 100 in FIG. 1. Deep learning operations may include convolution, pooling operation, elementwise operation (e.g., elementwise addition, elementwise multiplication, etc.), loading, reducing, other types of deep learning operations in the DNN, or some combination thereof. The compute block 300 may constitute a layer, or a portion of a layer, in the DNN. The compute block 300 may be a compute tile, e.g., in a DNN accelerator that has a tiled architecture. The DNN accelerator may include multiple compute tiles. These multiple compute tiles may operate in parallel.

In FIG. 3, the compute block 300 includes an input memory array 310, a weight memory array 320, an output memory array 330, and a PE array 340. In other embodiments, alternative configurations, different or additional components may be included in the compute block 300. For instance, the compute block 300 may include a sparsity acceleration module for accelerating deep learning operations based on sparsity in tensors of the DNN. Also, the DNN accelerator 200 may include more than one memory. Further, functionality attributed to a component of the compute block 300 may be accomplished by a different component included in the compute block 300 or by a different system.

The input memory array 310, weight memory array 320, and output memory array 330 are local memories of the compute block 300. In the embodiment of FIG. 3, the input memory array 310, weight memory array 320, and output memory array 330 are inside the compute block 300. In other embodiments, the input memory array 310, weight memory array 320, and output memory array 330 may be outside the compute block 300. The input memory array 310, weight memory array 320, and output memory array 330 and the compute block 300 may be implemented on the same chip.

The input memory array 310 stores input tensors of convolutions performed by the compute block 300. The input memory array 310 may include an array of input register files 315 (individually referred to as "input register file 315"). The input register files 315 may be arranged in columns, or columns and rows. In some embodiments, the layout of the input register files 315 in the input memory array 310 may be the same as or similar to a layout of the PE array 340. For instance, the input memory array 310 may have the same number of columns as the PE array 340. In each column, the number of input register files 315 may equal the number of PEs in the corresponding PE column. In an embodiment, an input register file 315 may be associated with a single PE and store activations used by the PE for MAC operations. The input register file 315 may store one or more input contexts to be used by the PE. Examples of the input memory array 310 include the memory array 600 in FIG. 6.

The weight memory array 320 stores kernels of convolutions performed by the compute block 300. The weight memory array 320 may include an array of weight register files 325 (individually referred to as "weight register file 325"). The weight register files 325 may be arranged in columns, or columns and rows. In some embodiments, the layout of the weight register files 325 in the weight memory array 320 may be the same as or similar to a layout of the PE array 340. For instance, the weight memory array 320 may have the same number of columns as the PE array 340. In each column, the number of weight register files 325 may equal the number of PEs in the corresponding PE column. In an embodiment, a weight register file 325 may be associated with a single PE and store weights used by the PE for MAC operations. The weight register file 325 may store one or more weight contexts to be used by the PE. Examples of the weight memory array 320 include the memory array 600 in FIG. 6.

The output memory array 330 stores output tensors of convolutions performed by the compute block 300. The output memory array 330 may include an array of output register files 335 (individually referred to as "output register file 335"). The output register files 335 may be arranged in columns, or columns and rows. In some embodiments, the layout of the output register files 335 in the output memory array 330 may be the same as or similar to a layout of the PE array 340. For instance, the output memory array 330 may have the same number of columns as the PE array 340. In each column, the number of output register files 335 may equal the number of PEs in the corresponding PE column. In an embodiment, an output register file 335 may be associated with a single PE and store output elements produced by the PE from MAC operations. Examples of the output memory array 330 include the memory array 1100 in FIG. 11.

The PE array 340 performs MAC operations in convolutions. The PE array 340 includes PEs 345 arranged in an array. The array may include a plurality of columns. An example of the PE array 340 is the PE array 400 in FIG. 4. An PE 345 may include one or more MAC units. A workload assigned to a PE 345 may be distributed to the MAC units. In an example where an PE 345 has multiple MAC units and the PE 345 receives an input context and a weight context (e.g., the input context 217 and weight context 227), the input context may be partitioned into segments. Each segment may include a subset of activations in the input context and be assigned to a different MAC unit. Similarly, the weight context may be partitioned into segments, and the segments can be provided to different ones of the MAC units. More details regarding PE are provided below in conjunction with FIG. 5.

Example PE Array

Figure 4:
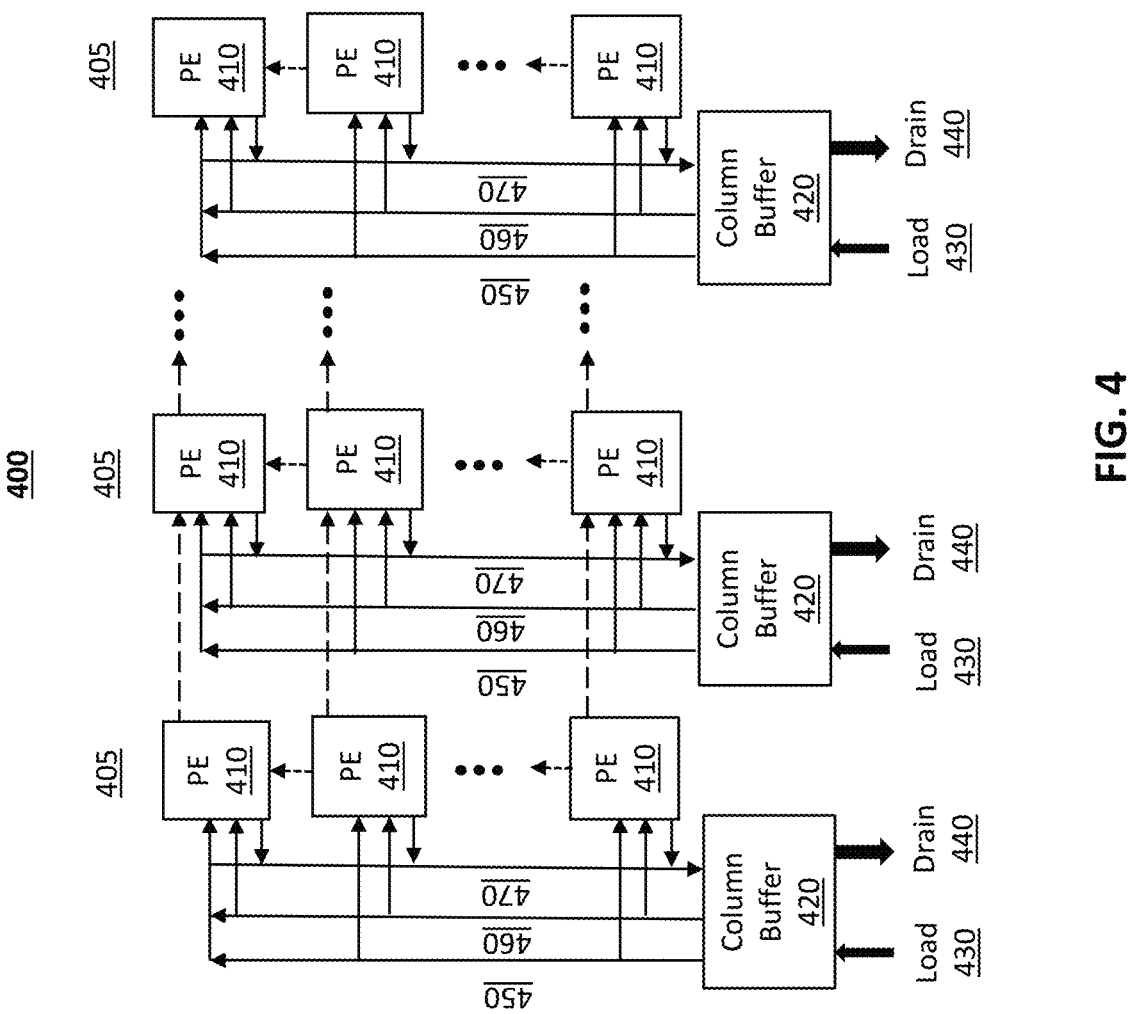
FIG. 4 illustrates a processing element (PE) array, in accordance with various embodiments.

FIG. 4 illustrates a PE array, in accordance with various embodiments. The PE array 400 is an embodiment of the PE array 340 in FIG. 3. The PE array 400 includes a plurality of PEs 410 (individually referred to as "PE 410"). The PEs 410 perform MAC operations, such as integer MAC operations, floating-point MAC operations, and so on. The PEs 410 may also be referred to as neurons or nodes in the DNN. Each PE 410 has 2 input signals 450 and 460 and an output signal 470. The input signal 450 is at least a portion of an IFM to the layer. The input signal 460 is at least a portion of a filter of the layer. In some embodiments, the input signal 450 of a PE 410 includes an input context, e.g., input context 217, and the input signal 460 includes a weight context, e.g., the weight context 227.

Each PE 410 performs an MAC operation on the input signals 450 and 460 and outputs the output signal 470, which is a result of the MAC operation. Some or all of the input signals 450 and 460 and the output signal 470 may be in an integer format, such as INT8, or FP format, such as FP16 or BF16. For purpose of simplicity and illustration, the input signals and output signal of all the PEs 410 have the same reference numbers, but the PEs 410 may receive different input signals and output different output signals from each other. Also, a PE 410 may be different from another PE 410, e.g., including more, fewer, or different components.

As shown in FIG. 4, the PEs 410 are connected to each other, as indicated by the dash arrows in FIG. 4. The output signal 470 of an PE 410 may be sent to many other PEs 410 (and possibly back to itself) as input signals via the interconnections between PEs 410. In some embodiments, the output signal 470 of an PE 410 may incorporate the output signals of one or more other PEs 410 through an accumulate operation of the PE 410 and generates an internal partial sum of the PE array 400

In the embodiments of FIG. 4, the PEs 410 are arranged into columns 405 (individually referred to as "column 405"). The input and weights of the layer may be distributed to the PEs 410 based on the columns 405. Each column 405 has a column buffer 420. The column buffer 420 stores data provided to the PEs 410 in the column 405 for a short amount of time. The column buffer 420 may also store data output by the last PE 410 in the column 405. The output of the last PE 410 may be a sum of the MAC operations of all the PEs 410 in the column 405, which is a column-level internal partial sum of the PE array 400. In other embodiments, input and weights may be distributed to the PEs 410 based on rows in the PE array 400. The PE array 400 may include row buffers in lieu of column buffers 420. A row buffer may store input signals of the PEs in the corresponding row and may also store a row-level internal partial sum of the PE array 400.

As shown in FIG. 4, each column buffer 420 is associated with a load 430 and a drain 440. The data provided to the column 405 is transmitted to the column buffer 420 through the load 430, e.g., through upper memory hierarchies. The data generated by the column 405 is extracted from the column buffers 420 through the drain 440. In some embodiments, data extracted from a column buffer 420 is sent to upper memory hierarchies. In some embodiments, the drain operation does not start until all the PEs 410 in the column 405 has finished their MAC operations.

In some embodiments, each PE column 405 may be associated with one or more MAC lanes. A MAC lane is a path for loading data (e.g., input signals 450 and 460) into a PE column. A MAC lane may be also referred to as a data transmission lane or data loading lane. A PE column may have multiple MAC lanes. The loading bandwidth of the PE column is an aggregation of the loading bandwidths of all the MAC lanes associated with the PE column. With a certain number of MAC lanes, data can be fed into the same number of independent MAC units simultaneously. These independent MAC units may be in the same PE. In some embodiments where a PE column has four MAC lanes for feeding activations or weights into the PE column and each MAC lane may have a bandwidth of 16 bytes, the four MAC lanes can have a total loading bandwidth of 64 bytes. In an embodiment where the activation or weight data was unicasted, four MAC units in one PE may receive the data. In another embodiment where the activation or weight data was multicoated, up to eight PEs and four MAC units in these PEs may receive the data. In some embodiments, the data reuse pattern of the DNN accelerator may determine how many PEs with four MAC units can receive the data.

Figure 5:
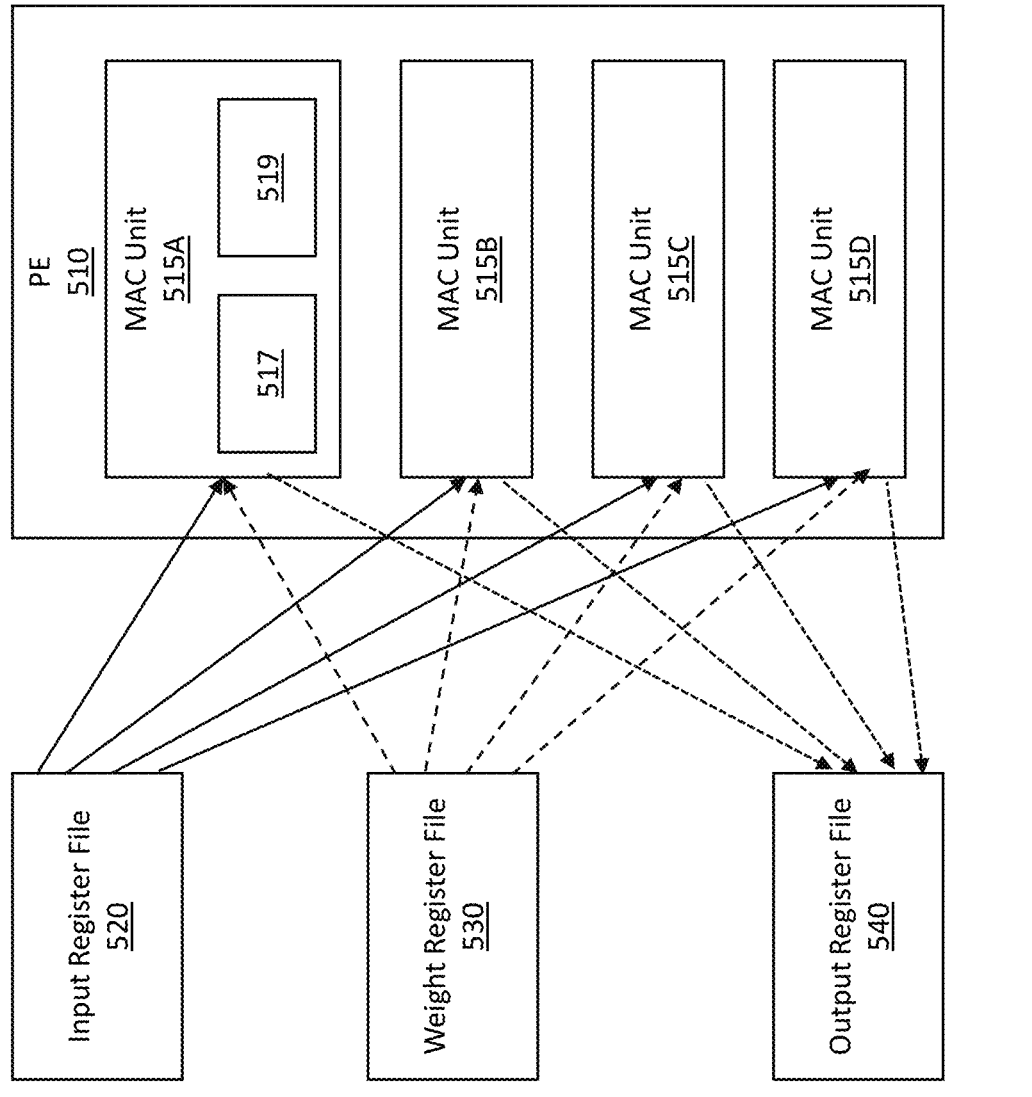
FIG. 5 illustrates a PE coupled to register files, in accordance with various embodiments.

FIG. 5 illustrates a PE 510 coupled to register files, in accordance with various embodiments. The PE 510 may be an embodiment of the PE 345 in FIG. 3 or of the PE 410 in FIG. 4. In the embodiments of FIG. 5, the PE 510 includes four MAC units 515A-515D (collectively referred to as "MAC units 515" or "MAC unit 515"). In other embodiments, the PE 510 may include fewer or more MAC units.

The register files, to which the PE 510 is coupled to, include an input register file 520, a weight register file 530, and an output register file 540. The input register file 520 temporarily stores activations to be used by the MAC units 515 for MAC operations. The weight register file 530 temporarily stores weights to be used by the MAC units 515 for the MAC operations. The output register file 540 temporarily stores output elements produced by the MAC units 515 from the MAC operations. The input register file 520 may be an embodiment of the input register file 315 in FIG. 3. The weight register file 530 may be an embodiment of the weight register file 325 in FIG. 3. The output register file 540 may be an embodiment of the output register file 335 in FIG. 3.

The MAC units 515 perform MAC operations on data in the input register file 520 and weight register file 530. The MAC unit 515A includes a multiply unit 517 and an accumulate unit 519. The multiply unit 517 performs multiply operations on activations in the input register file 520 and weights in the weight register file 530. The amount of time needed by the multiply unit 517 for a multiple operation may depend on the sparsity level of the weights used in the multiple operation. If the weights are denser (i.e., the sparsity level is lower), the multiply unit 517 needs more time to perform the multiple operation. The accumulate unit 519 performs accumulate operations on the output of the multiply unit 517 and outputs signals from other MAC units 515 or other PEs. The output of the accumulate unit 590 is the output signal of the MAC unit 515A. Even though not shown in FIG. 5, the MAC unit 515B or MAC unit 515C may also include a multiply unit 517 and an accumulate unit 519.

Example Memory Arrays

Figure 6:
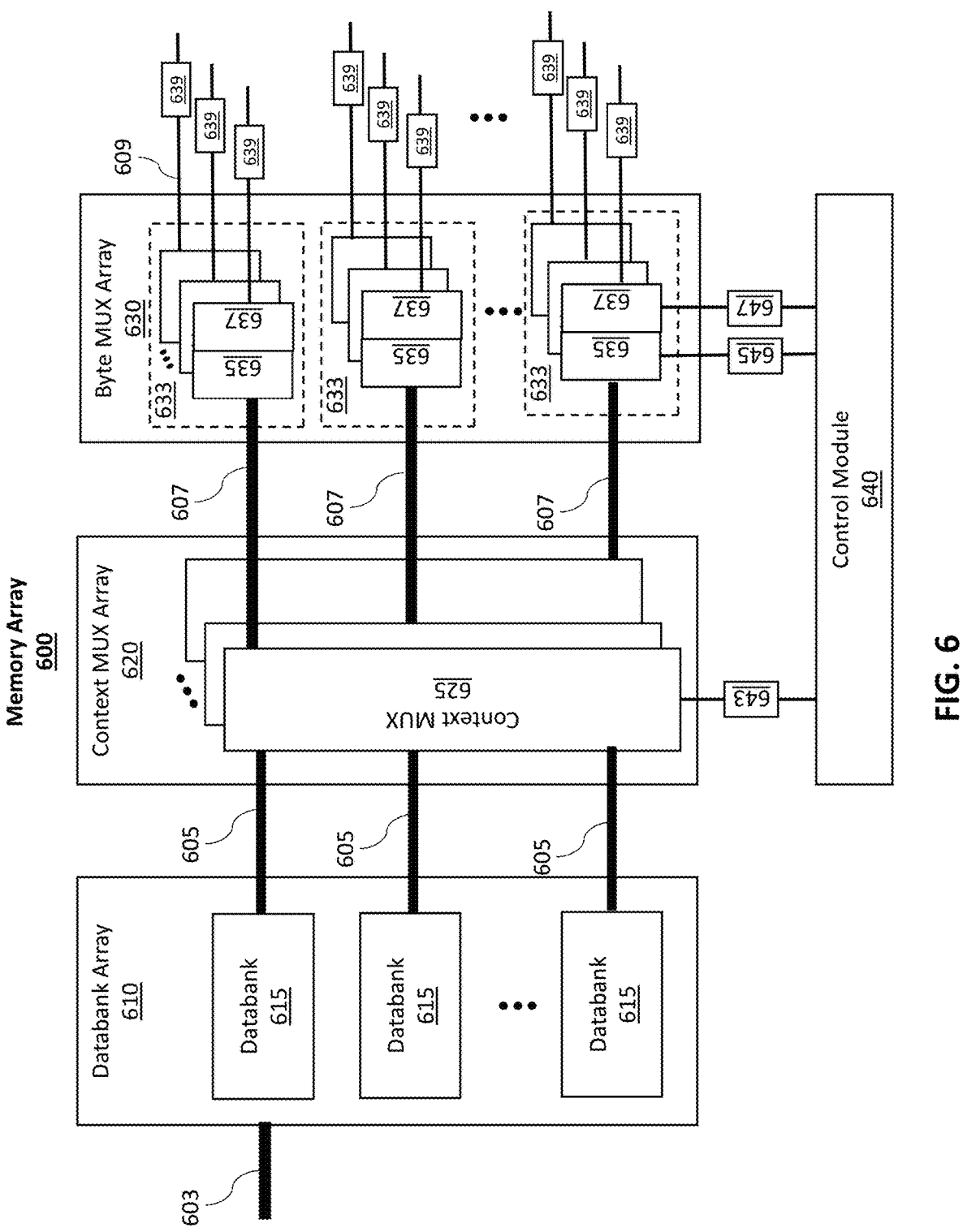
FIG. 6 illustrates an example memory array, in accordance with various embodiments.

FIG. 6 illustrates an example memory array 600, in accordance with various embodiments. The memory array 600 may be an embodiment of at least a portion of the input memory array 310 or an embodiment of at least a portion of the weight memory array 320. In some embodiments (e.g., embodiments where the input memory array 310 or weight memory array 320 includes register files arranged in columns), the memory array 600 may be an example column in the input memory array 310 or an example column in the weight memory array 320. The memory array 600 may correspond to a PE column, e.g., PE column 405 in FIG. 4. The memory array 600 may store data (e.g., activations or weights) to be used by PEs in the PE column for performing MAC operations.

As shown in FIG. 6, the memory array 600 includes a databank array 610, a context MUX array 620, a byte MUX array 630, and a control module 640. FIG. 6 also shows data lines 603, 605, 607, and 609. Data is written into the memory array 600 through the data line 603. The data line 603 may be referred to as the write line or data input line. Data is sent out from the memory array 600 through the data lines 609 (individually referred to as "data line 609"). A data line 609 may be referred to as a data output line. Within the memory array 600, data can be transferred between components of the memory array 600 through the data lines 605 (individually referred to as "data line 605") and the data lines 607 (individually referred to as "data line 607"). In other embodiments, alternative configurations, different or additional components may be included in the memory array 600. Also, the memory array 600 may include more than one memory. Further, functionality attributed to a component of the memory array 600 may be accomplished by a different component included in the memory array 600 or by a different system.

The databank array 610 includes an array of databanks 615 (individually referred to as "databank 615"). The number of databanks 615 in the databank array 610 may depend on the number of PEs in the corresponding PE column. A databank 615 may be configured to store a context (input context or weight context) at a time. In some embodiments, a storage capacity of the databank 615 is equal to or more than the size of the context. In an example, the storage capacity of the databank 615 is at least 16 bytes. A databank 615 may be a register file, e.g., an input register file 315 or a weight register file 325. In some embodiments, a databank 615 may include a plurality of flip-flops (or latches). A flip-flop may store a single bit. A flip-flop may have two states: one state represents one, and the other state represents zero. The number of flip-flops in a databank 615 may be no less than the number of bits in a context.

The databank array 610 is coupled to the data line 603. The data line 603 may be used for writing data into some or all of the databanks 615 in the databank array 610. In some embodiments, the databanks 615 share the data line 603. In other embodiments, the memory array 600 may include more than one data line 603 for different ones of the databanks 615. The data line 603 may include one or more wires for data transfer. Each wire may be used to transfer a bit at a time. The number of wires in the data line 603 may be 4, 8, 16, 32, 64, and so on. In some embodiments, each wire in the data line 603 is connected to an address in a databank 615.

In some embodiments, the wires in the data line 603 may be implemented for sequential gray addressing. For instance, the wires may be arranged sequentially, and each wire in the sequence is for a different address in the databank 615. The sequence of the wires may be gray coded, as opposed to binary coded. With gray coding, for wires that are arranged adjacently (i.e., right next to each other), the address of the first wire is different from the address of the second wire by a single bit. That way, changing the single bit can switch the address for the first wire to the address of the second wire. In an example where a first wire, a second wire, and a third wire are arranged adjacently in the sequence, the address of the first wire ("first address") is 00001, the address of the second wire ("second address") is 00011, and the address of the third wire ("third address") is 00010. Thus, the first address can be switched to the second address by changing the second last bit from 0 to 1, but the other bits in the first address do not need to be changed. Also, the second address can be switched to the third address by changing the last bit from 1 to 0, but the other bits in the second address do not need to be changed.

With the gray coding implement, the wires in the data line 603 can facilitate data read in the gray-coded order. For each new read operation, a singled bit in the address for the previous read operation needs to be changed but the other bits in the address can remain same. This can reduce the amount of switching needed for the reading operations and therefore, reduce power consumed for data write and read. More details regarding sequential gray addressing are provided below in conjunction with FIGS. 8A and 8B.

The context MUX array 620 and the byte MUX array 630 facilitates reading data from the databank array 610. The context MUX array 620 and the byte MUX array 630 includes MUXs that can direct bits in the databank array 610 to proper data output lines, e.g., to the data lines 609. The context MUX array 620 and the byte MUX array 630 may facilitate selection of proper bytes as inputs to PEs. Operations of the context MUX array 620 and the byte MUX array 630 may be controlled by the control module 640. For instance, the control module 640 may provide addresses from which data is to be read to the context MUX array 620 and the byte MUX array 630. The addresses may be gray coded. More details about the control module 640 is provided below.

The context MUX array 620 includes a plurality of context MUXs 625 individually referred to as "context MUX 625"). A context MUX 625 is connected to a databank 615 through a data line 605. In an example where a databank 615 stores a context having 16 bytes, the data line 605 may facilitate transfer of 128 bits. The context MUX 625 selects, e.g., from contexts stored in the databanks 615, a context to be transmitted to a PE. The context MUX 625 can read from multiple flip-flops in the databank 615 and combine these bits into a single output. In an example, a context MUX 625 may be a quad MUX, i.e., a 4:1 MUX, which has four inputs and one output. The context MUX 625 may read data from four-bit memory locations at a time. The number of context MUXs 625 in the context MUX array 620 may equal the number of databanks 615 in the databank array 610. In some embodiments, different context MUXs 625 read data from different databanks 615 through different data lines 605. The context MUXs 625 may operate in parallel. The context MUXs 625 may operate separately from each other as they can read contexts from different databanks 615 using different data lines 605. A context MUX 625 can direct the context stored in the corresponding databank 615 to the corresponding MUXs in the byte MUX array 630.

The byte MUX array 630 directs data from the context MUX array 620 to the data lines 609. The byte MUX array 630 can select bytes to be transmitted to a PE from the context that was selected by the context MUX 620. The byte MUX array 630 includes a plurality of byte MUX assemblies 633. Each byte MUX assembly 633 receives data from a different context MUX 625 through a different data line 607. In some embodiments, the number of byte MUX assemblies 633 in the byte MUX array 630 may equal the number of context MUXs 625 in the context MUX array 620 or the number of databanks 615 in the databank array 610. An individual byte MUX assembly 633 may include one or more byte MUX set. A byte MUX set includes two MUXs 635 and 637. One or both MUXs 635 and 637 may be 4:1 MUXs. In an example where both MUXs 635 and 637 are 4:1 MUXs, the combination of the MUXs 635 and 637 may constitute a 16:1 MUX. Even though FIG. 6 shows that a byte MUX assembly 633 includes at least three byte MUX sets, a byte MUX assembly 633 may include fewer byte MUX sets. In some embodiments (e.g., embodiments where a byte MUX set reads data for a multiplier in a PE), the number of byte MUX sets in a byte MUX assembly 633 may equal or be greater than the number of multipliers in a PE.

The MUXs 635 and 637 provide two-stage multiplexing. In some embodiments, the MUX 635 pre-reads data in the first stage, which is controlled by the least frequently switching address bits. The MUX 637 read data in the second stage, which is controlled by the most frequently switching address bits. Address bits are bits in an address. In an example, an address may include four bits, bits [3:0]. Example addresses may be 0000, 0001, 0010, 0011, and so on. In some embodiments, bits [0:1] in the address may be more frequently changed than bits[2:3]. Bits[2:3] may control the first stage multiplexing by the MUX 635, and bits [0:1] may control the second stage multiplexing by the MUX 635. In other embodiments, bits [0:1] in the address may be less frequently changed than bits[2:3]. Bits [0:1] may control the first stage multiplexing by the MUX 635, and bits[2:3] may control the second stage multiplexing by the MUX 635. Bits[0:1] are the first two bits, and bits[2:3] are the last two bits. Taking the address 0011 for example, bits[0:1] are 00, and bits[2:3] are 11. The partition of address bits between the two MUXs 635 and 637 may be controlled by the control module 640. With the two-stage multiplexing, power efficiency for reading dense activations or weights can be improved or optimized through feeding the mostly frequently switching address bits to the MUX 637 to multiplex out the pre-read data with less power.

In some embodiments, one or both of the MUXs 635 and 637 are quad MUXs. The output of the two-stage multiplexing can be sent out from the memory array, e.g., to a PE, through the data lines 609. In some embodiments, the output from a byte MUX set is a byte that includes eight bits arrange in a sequence. The byte may be an activation or weight. The byte can be transmitted, through a data line 609, to a multiplier in a PE, and the multiplier can perform multiplication on the activation or weight. The data line 609 is implemented with a flip-flop array 639. The flip-flop array 639 may include plurality of flip-flops arranged in a sequence. In an example, the flip-flop array 639 includes eight flip-flips and can temporarily store a byte before the byte can be sent to the PE.

The control module 640 controls data read operations by the context MUX array 620 and the byte MUX array 630. The control module 640 may include a state machine, e.g., a finite state machine. The control module 640 may generate a read request for a read operation by a context MUX 625 in the context MUX array 620. The read request may include one or more addresses in a databank 615 form which data is to be read by the context MUX 625. The read request may be temporarily stored at a flip-flop array 643. The flip-flop array 643 may include one or more flip-flops for storing the address. In an example, the flip-flop array 643 includes four flip-flops for storing a four-bit address.

The control module 640 also generates read requests for the MUXs 635 and 637. A read request for a MUX 635 includes the least frequently switching address bits in an address. The request may be temporarily stored at a flip-flop array 645 before it is received by the MUX 635. A read request for a MUX 637 includes the highest frequently switching address bits in an address. The request may be temporarily stored at a flip-flop array 647 before it is received by the MUX 637. The flip-flop array 645 or 647 may include one or more flip-flops for storing the address. In an example, the flip-flop array 645 or 647 includes four flip-flops for storing a four-bit address.

To determine addresses in read requests for the context MUX array 620 and the byte MUX array 630, The control module 640 may generate gray codes, e.g., through a binary to gray decoder. The control module 640 may change a binary-based sequence of addresses into a gray-based sequence of addresses. In a binary-based sequence of addresses, multiple address bits may need to be switched to change from an address to its adjacent address in the sequence. That can cause more power consumption in the read operations by the context MUX array 620 and the byte MUX array 630. In contrast, in a gray-based sequence of addresses, a single address bit needs to be switched to change from an address to its adjacent address in the sequence, which can therefore save power for read operations. More details regarding binary addressing and gray addressing are provided below in conjunction with FIGS. 8A and 8B.

Figure 7:
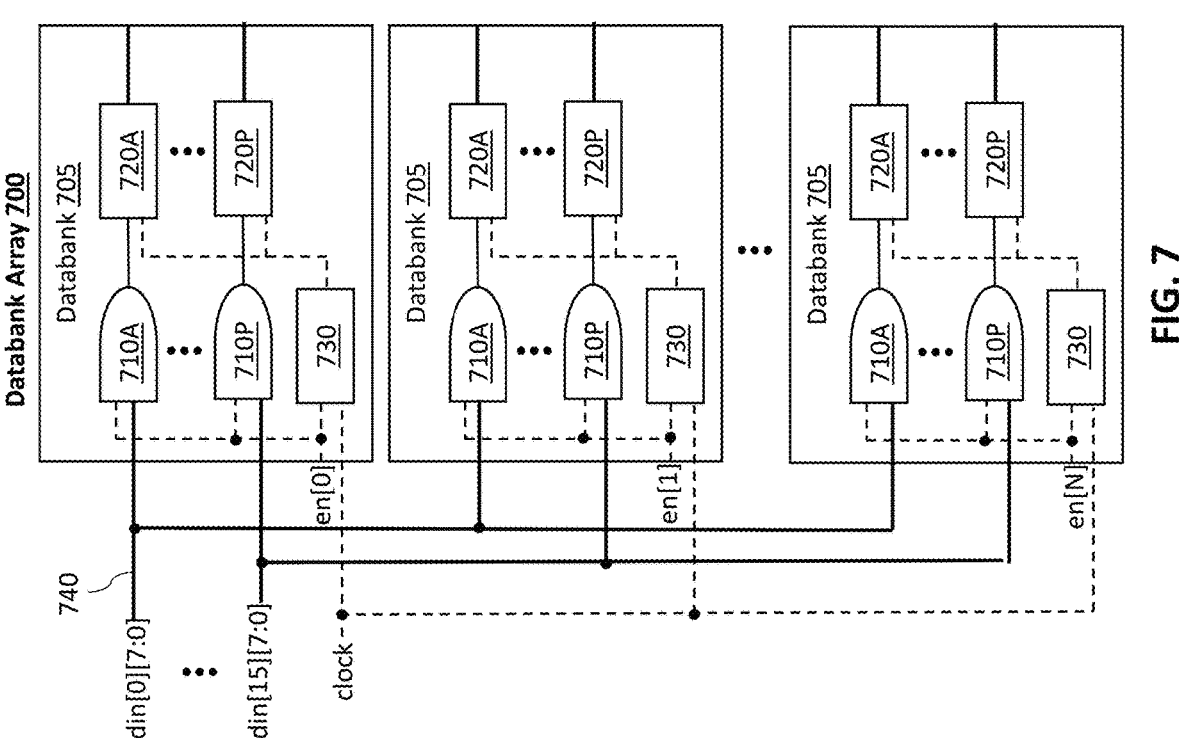
FIG. 7 illustrates an example databank array, in accordance with various embodiments.

FIG. 7 illustrates an example databank array 700, in accordance with various embodiments. The databank array 700 may be an embodiment of the databank array 610 in FIG. 6. The databank array 700 includes a plurality of databanks 705 (individually referred to as "databank 705"). A databank 705 may be an embodiment of a databank 615 in FIG. 6. In some embodiments, each databank 705 stores one context. For purpose of illustrations, a context in FIG. 7 includes 16 bytes.

As shown in FIG. 7, each databank 705 includes 16 logic gates 710A-710P (collectively referred to as "logic gates 710" or "logic gate 710"), 16 flip-flop arrays 720A-720P (collectively referred to as "flip-flop arrays 720" or "flip-flop array 720"), and an ICG unit 730. In other embodiments, a databank 705 may include a different number of logic gates 710, a different number of flip-flop arrays 720, or a different number of ICG unit 730.

Each databank 705 may receive din[0][7:0]-din[15][7:0] through a data line 740. The number in the first double bracket indicates an index of a byte, which can be any integer from 0 to 15. The numbers in the second double bracket [7:0] indicates that each byte has eight bits. The databanks 705 may share the data line 740. In some embodiments, the data line 740 may transfer a fixed number of bits at a time. The fixed number may be 4, 8, 16, 32, 64, and so on. The data line 740 may include wires arranged based on gray codes. Each wire may be connected to an address in a databank 705. By arraying the wires based on gray codes, the sequence of the addresses may follow the gray coding sequence, i.e., the difference between two adjacent addresses in the sequence is a single address bit. The data line 740 may be an embodiment of the data line 603 in FIG. 6.

Data from the data line 740 are written into the flip-flop arrays 720. A flip-flop array 720 includes one or more flip-flops. In some embodiments, a flip-flop array 720 includes a sequence of flip-flops. For purpose of illustration, a flip-flop array 720 in FIG. 7 can include eight flip-flops for storing eight bits, i.e., a byte. In other embodiments, a flip-flop array 720 includes a multi-bit flip-flop, e.g., a 4-bit flip-flop, 8-bit flip-flop, etc. A flip-flop in the flip-flop array 720 may be an edge-triggered flip-flop, e.g., a negative edge-triggered flip-flop or a positive edge-triggered flip-flop. In some embodiments, a flip-flop array 720 stores eights bits in the same byte. In other embodiments (e.g., embodiments where bit packing is implemented), a flip-flop array 720 may store bits from different bytes, and the bits may have the same index, e.g., the bits are bits[0] in the different bytes.

The flip-flop arrays 720 are gated to make sure that the contexts are stored in the right databanks 705. As shown in FIG. 7, each flip-flop array 720 is coupled to a logic gate 710. The logic gate 710 may be connected to the data line 740. In some embodiments, a logic gate 710 may be an AND gate. In other embodiments, a logic gate 710 may be an OR gate. The logic gates 710 in a databank 705 are coupled to the ICG unit 730. The ICG unit 730 receives an enable signal, which is shown as "en[0]," "en[1]," or "en[N]" in FIG. 7, and a clock signal from the clock. The ICG unit 730 may gate the clock signal based on the enable signal. For instance, the ICG unit 730 may prevent the states of the flip-flops in the databank 705 from being changed when the clock signal is high (e.g., the clock signal is one) but the enable signal is low (e.g., the enable signal is zero). As the states of the flip-flops cannot be changed, data cannot be written into the databank 705. The ICG unit 730 may allow the states of the flip-flops in the databank 705 to be changed when the clock signal is high (e.g., the clock signal is one) and the enable signal is also high (e.g., the enable signal is one), so that data may be written into the databank 705. In an example where en[0] is high and en[1]-en[N] are low, data can be written into the first databank 705 and cannot be written into the other databanks 705.

In some embodiments, the ICG unit 730 by itself may not be able to fully disable flip-flops for unselected contexts, e.g., a context that is not selected for the databank 705 where the flip-flops are located. A flip-flop may include two latches: a first latch (also referred to as a master latch) and a second latch (also referred to as a slave latch). In some embodiments, the second latch is controlled by the first latch. Despite that the ICG 730 is gating the clock signal and the enable signal is low, internal nodes associated with the first latch may still change states. In such cases, the logic gate 710 coupled to the flip-flop can prevent the toggling of the internal nodes associated with the first latch. With the combination of the ICG unit 720 and the logic gate 710, flip-flops can be fully disabled for unselected contexts.

Even though FIG. 7 shows 16 logic gates 710A-710P and 16 flip-flop arrays 720A-720P in each databank 705, a databank 705 may include a different number of logic gates 710 or a different number of flip-flop arrays 720. Also, a flip-flop array 720 may include a different number of flip-flops and store a different number of bits. The number of databanks 705 in the databank array 700 may vary. In some embodiments, the number of databanks 705 in the databank array 700 is related to the number of PEs in a PE array or in a portion (e.g., a column) of a PE array.

FIG. 8A illustrates sequential binary addressing, in accordance with various embodiments. FIG. 8B illustrates sequential gray addressing, in accordance with various embodiments. FIG. 8A show a table that lists 16 addresses arranged in a sequence determined based on binary coding. FIG. 8B show a table that lists the same 16 addresses, but arranged in a sequence determined based on gray coding. For purpose of illustration, FIGS. 8A and 8B includes 16 addresses. Each address include four bits: bits[0:3]. In other embodiments, there can be a different number of addresses, e.g., 32. Also, an address may include a different number of bits.

As shown in FIG. 8A, the first row of the table is indexes of the addresses. The second row of the table is binary codes of the addresses. The order of these addresses is based on binary coding, i.e., the order of 0, 1, 2, 3, . . . 16. With binary coding, two adjacent addresses may have multiple different bits. For instance, the address 0001 (1) and the address 0010 (2) have two bits that are different: bit[2] and bit[3]. To switch from the address 0001 to the address 0010, two bits must be switched. Similarly, the address 1011 (11) and the address 1100 (12) have three bits that are different: bit[1], bit[2], and bit[3]. To switch from the address 1011 to the address 1100, three bits must be switched.

The sequence of the addresses is different in FIG. 8B. The order in FIG. 8B is 0, 1, 3, 2, 6, 7, . . . 8. The order is determined based on gray coding. With gray coding, two adjacent addresses have a single different bit. For instance, the address 0001 (1) and the address 0011 (3) have one bit that is different: bit[2]. Similarly, the address 1011 (11) and the address 1001 (9) have one bit that is different: bit[2]. Any two adjacent addresses in the sequence in FIG. 8B has a single different bit. Compared with the sequence in FIG. 8A, the amount of switching needed for reading data sequentially from these addresses can be reduced. Accordingly, the power consumed for reading the data can be reduced.

Figure 9:
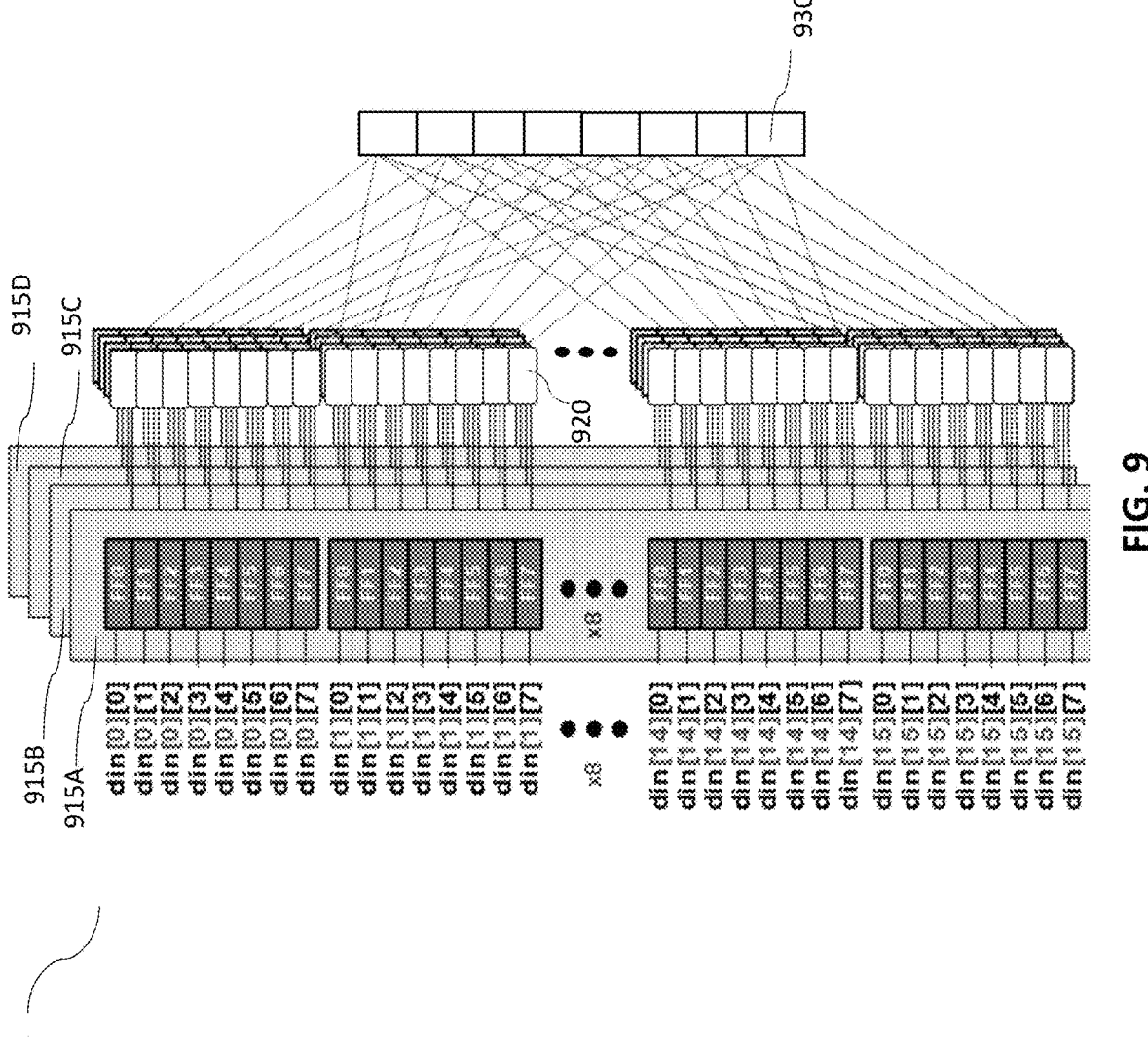
FIG. 9 illustrates a memory array without bit packing, in accordance with various embodiments.

FIG. 9 illustrates a memory array 900 without bit packing, in accordance with various embodiments. The memory array 900 may be an example of at least a portion of the memory array 600 in FIG. 6. The memory array 900 includes four databanks 915A-915D (collectively referred to as "databanks 915" or "databank 915"), context MUXs 920 (individually referred to as "context MUX 920"), and byte MUXs 930 (individually referred to as "byte MUX 930"). In other embodiments, the memory array 900 may include fewer, more, or different components.

A databank 915 may store a context at a time. The databank 915 may store contexts in parallel. For purpose of illustration, a context in the embodiments of FIG. 9 has 16 bytes, so 128 bits. A databank 915 includes 16 flip-flop arrays. For purpose of simplicity, FIG. 9 shows the first two flip-flop arrays and the last two flip-flop arrays. There are 12 additional flip-flop arrays between the first flip-flop array and the second flip-flop array. A flip-flop array includes eight flip-flops, which are shown as FF0-FF7 in FIG. 9. Each flip-flop 910 may be used for a single bit.

Each flip-flop array is used for storing a byte, and each flip-flop in a flip-flop array stores a bit in the byte. As shown in FIG. 9, FF0 stores the first bit, FF1 stores the second bit, and so on. The bits are then read by the context MUXs 920 and the byte MUXs 930 and further sent to multipliers in PEs for MAC operations. In the embodiments of FIG. 9, the number of context MUXs 920 in the memory array 900 equals the number of flip-flops in the memory array 900. Each context MUX 920 may be coupled to a different flip-flop. Each byte MUX 930 is coupled to 16 context MUX 920 for reading bits from 16 different bytes. For instance, the top byte MUX 930 is coupled to the context MUX 920 for the 16 flip-flops used for bit[0] of the 16 bytes. There are eight byte MUXs 930 in total. A data line is used to connect a context MUX 920 to the corresponding byte MUX 930. A data line may be a wire for transferring one bit at a time. Accordingly, there can be 128 data lines. As shown in FIG. 9, these data lines cross. Also, some data lines are long due to the long physical distance between some context MUXs 920 and byte MUXs 930. For example, there is a long data line connecting the context MUX 920 for din[0][0] and the bottom byte MUX 930. As another example, the data line connecting the context MUX 920 for din[15][7] and the top byte MUX 930 is also long. Such a layout may have high hardware costs.

Figure 10:
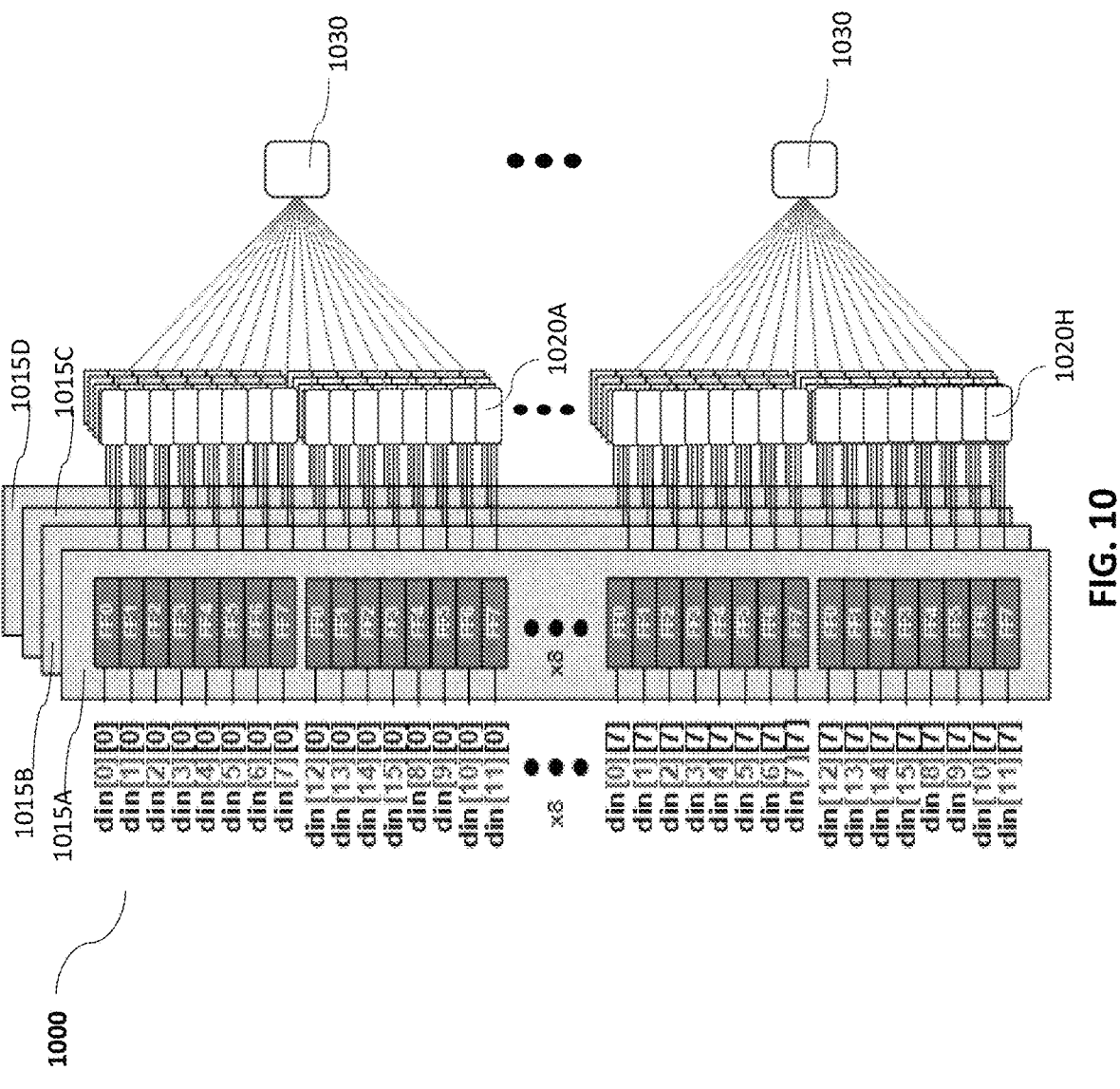
FIG. 10 illustrates a memory array with bit packing, in accordance with various embodiments.

FIG. 10 illustrates a memory array 1000 with bit packing, in accordance with various embodiments. The memory array 1000 may be an example of at least a portion of the memory array 600 in FIG. 6. The memory array 1000 includes four databanks 1015A-1015D (collectively referred to as "databanks 1015" or "databank 1015"), context MUXs 1020 (individually referred to as "context MUX 1020"), and byte MUXs 1030 (individually referred to as "byte MUX 1030"). In other embodiments, the memory array 1000 may include fewer, more, or different components.

A databank 1015 may store a context at a time. The databank 1015 may store contexts in parallel. For purpose of illustration, a context in the embodiments of FIG. 10 has 16 bytes, so 128 bits. A databank 1015 includes 16 flip-flop arrays. For purpose of simplicity, FIG. 10 shows the first two flip-flop arrays and the last two flip-flop arrays. There are 12 additional flip-flop arrays between the first flip-flop array and the second flip-flop array. A flip-flop array includes 8 flip-flops, which are shown as FF0-FF7 in FIG. 10. Each flip-flop 1010 may be used for a single bit. The layout of the flip-flops in the databank 1015 may be the same as the layout of the flip-flops in the databank 915.

Different from the memory array 900, the memory array 1000 is implemented with bit packing. In the memory array 900, a flip-flop array stores a byte. In contrast, a flip-flop array in the memory array 1000 stores eight bits from eight different bytes, and two flip-flop arrays can store 16 bits from all the 16 bytes in the contexts. These 16 bits have the same index, e.g., the 16 bits stored in the first two flip-flop arrays are all bit[0], and the 16 bits stored in the last two flip-flop arrays are all bit[7].

The bit packing can make the distance between the context MUXs 1020 and the byte MUXs 1030 closer. As shown in FIG. 10, the top byte MUX 1030 is connected to the context MUXs 1020 for the first two flip-flop array, and the bottom byte MUX 1030 is connected to the context MUXs 1020 for the last two flip-flop array. The data lines connecting these MUXs do not cross, and they are shorter compared with the data lines in FIG. 9. It can therefore reduce hardware costs and can also save power consumed by longer data lines. For purpose of illustration, FIG. 10 does not show the other byte MUXs 1030. There can be six additional byte MUXs 1030 arranged between the top byte MUX 1030 and the bottom byte MUX 1030. Also, there are other context MUXs 1020 in addition to the ones shown in FIG. 10.

As shown in FIG. 10, the memory array 1000 includes 16 context MUXs 1020A (individually referred to as "context MUX 1020A") that are individually coupled to the 16 flip-flops 1010 in the first and second flip-flop arrays. FIG. 10 also shows 16 context MUXs 1020H (individually referred to as "context MUX 1020H") that are individually coupled to the 16 flip-flops 1010 in the second to last and last flip-flop arrays. For purpose of simplicity, FIG. 10 does not show context MUXs 1020B-1020G, which are coupled to the other six flip-flop arrays.

In some embodiments, bits are written into the databanks 1015 through wires that are arranged sequentially based on gray coding. With gray coding, the addresses of wires that are arranged adjacently (i.e., right next to each other) are different by a single bit, and the other bits in the addresses are the same. That way, changing the single bit can switch from one address to the other address. With such hard-wired gray coding, data can be written in a gray-coded order, which can reduce the amount of switching needed for the write operations and therefore, reduce power consumed for data write. Hard-wired gray coding reduces the need for gray-coded read address decoders and gray-coded write decoders thus saving area and power. In the example, the bit[0] is written to the top two flip-flop arrays in the byte order din[0], din[1], din[2], din[3], din[4], din[5], din[6], din[7], din[12], din[13], din[14], din[15], din[8], din[9], din[10], din[11] for hard-wired gray coded write. Further, the bit[7] is written to bottom two flip-flop arrays in the byte order din[0], din[1], din[2], din[3], din[4], din[5], din[6], din[7], din[12], din[13], din[14], din[15], din[8], din[9], din[10], din[11] for hard-wired gray coded write.

Figure 11:
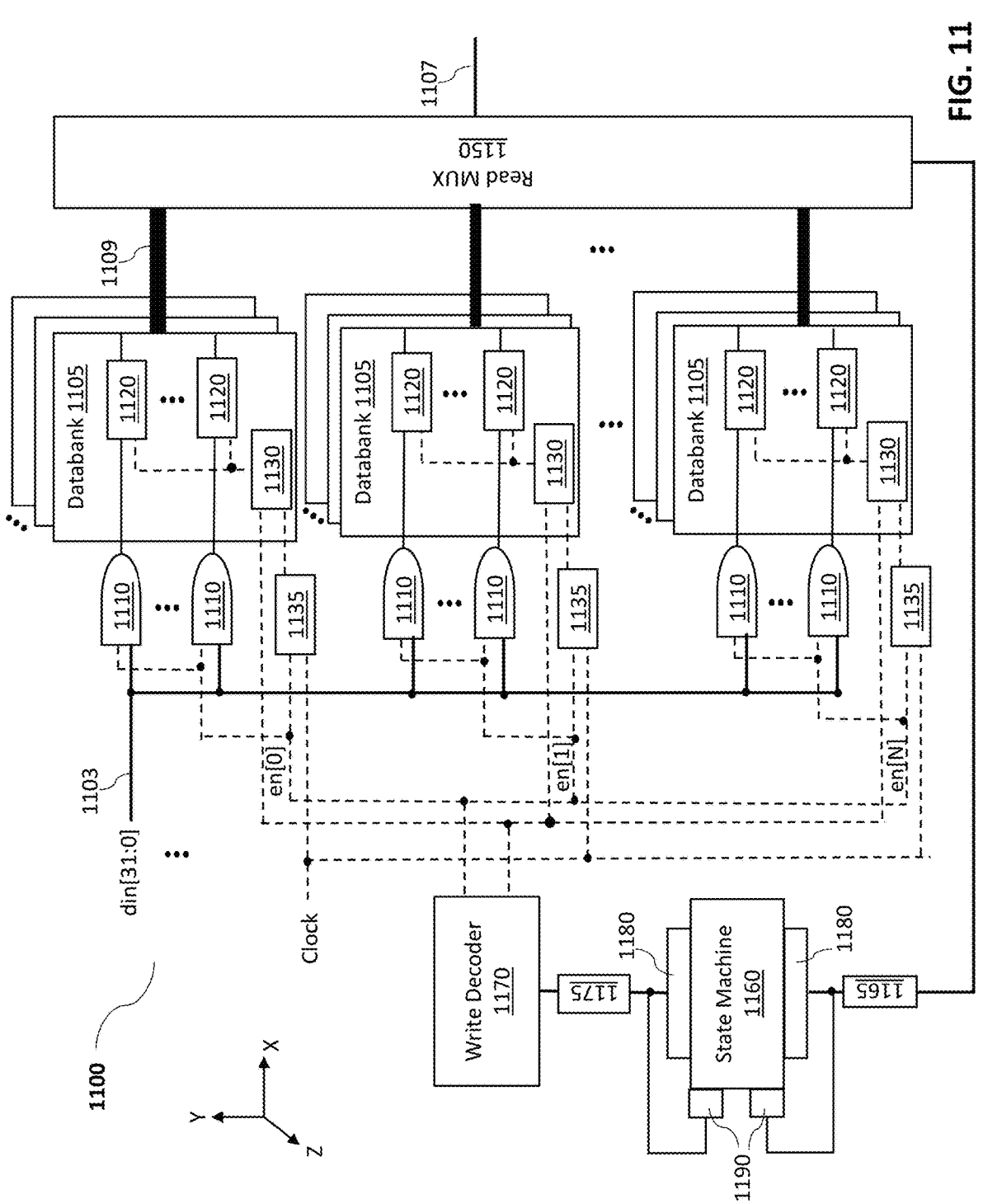
FIG. 11 illustrates another example memory array, in accordance with various embodiments.

FIG. 11 illustrates another example memory array 1100, in accordance with various embodiments. The memory array 1100 may be an embodiment of at least a portion of the output memory array 330 in FIG. 3. In some embodiments (e.g., embodiments where the output memory array 330 includes output register files arranged in columns), the memory array 1100 may be an example column in the output memory array 330. The memory array 1100 may correspond to a PE column, e.g., PE column 405 in FIG. 4. The memory array 1100 may store data (e.g., activations or weights) to be used by PEs in the PE column for performing MAC operations.

As shown in FIG. 11, the memory array 1100 includes data lines 1103, 1109, and 1107, and a plurality of databanks 1105 (individually referred to as "databank 1105"), logic gates 1110 (individually referred to as "logic gate 1110"), ICG units 1135 (individually referred to as "ICG unit 1135"), a read MUX 1150, a state machine 1160, a write decoder 1170, decoders 1180 and 1190, and flip-flop arrays 1165 and 1175. In other embodiments, the memory array 1100 may include fewer, more, or different components.

Data is written into the databanks 1105 through the data line 1103. The data line 1103 may be referred to as the write line or data input line. In some embodiments, the data line 1103 may transfer 32 bits (din[31:0]) at a time. The data line 1103 may include a bundle of 32 wires, each of which can transfer one bit at a time. The data line 1103 may be coupled to one or more PEs in a PE array, e.g., the PE array 340. Results of MAC operations performed by the PEs can be transferred from the PEs to the databanks 1105 through the data line 1103. In some embodiments, the data line 1103 is for a PE column in the PE array.

Each databank 1105 includes a series of flip-flop arrays 1120 for storing data. In some embodiments, a databank 1105 may store 32 bits at a time. For instance, the databank 1105 includes four flip-flop arrays 1120, and each flip-flop array includes eight flip-flops. Each flip-flop array 1120 includes an ICG unit 1130 and is coupled with a logic gate 1110 and another ICG unit 1135. The ICG units 1130 and 1135 may receive clock signals and enable signals and synchronize the enable signals with clock signals. Each flip-flop array 1120 is gated by the ICG units 1130 and 1135 and the logic gate 1110. The ICG units 1130 and 1135 and logic gate 1110 can control states of the flip-flops in the corresponding flip-flop array 1120 based on the synchronized enable signal. With clock gating using ICG units 1130 and 1135, data selected for a databank 1105 can be written into the databank 1105 but not into other databanks 1105. With the data gating, a logic gate 1110 can prevent unintended data transitions on the internal nodes associated with the first latch in the corresponding flip-flop 1120, and therefore, reduce power consumed by writing data into the databanks 1105. Each data line 1103, is coupled to 64 contexts in this example, where a plurality of logic gates 1110 prevent spurious transitions to 63 of the un-selected contexts.

Data is sent out from the databanks 1105 to the read MUX 1150 through the data lines 1109 (individually referred to as "data line 1109"). The number of data lines 1109 in the memory array 1100 may equal the number of databanks 1105 in the memory array 1100. Each data line 1109 may be used for a different subset of the databanks 1105. In some embodiments, the databanks 1105 in the memory array 1100 may be arrange in columns and rows. For instance, the databanks 1105 in a column may be arranged along the Y-axis, and the databanks 1105 in a column may be arranged along the Z axis. Each data line 1109 may be used for a different row of databanks 1105. A data line 1109 may transfer 32 bits from each of the databanks 1105 in the corresponding row to the read MUX 1150. The total number of bits transmitted through a data line 1109 at a time may be a product of 32 and the number of databanks 1105 in the row. In an example where the databanks 1105 in the memory array 1100 are arranged in 16 rows and 4 columns, the memory array 1100 may include 4 data lines 1109, each of which can transfer 16×32 bits at a time.

The read MUX 1150 facilitates reading data from the databanks 1105. The read MUX 1150 may have multiple inputs and a single output. For instance, the read MUX 1150 can read bits from different databanks 1105 and combine the bits into one sequence. An example of the read MUX 1150 is a 32-bit 64:1 MUX, which has 64 inputs and one output. The output of the read MUX 1150 may be transmitted through the data line 1107. The data line 1107 may include 32 wires and can transfer up to 32 bits at a time. The data line 1107 may be coupled to one or more other PEs, e.g., another PE column, another PE array, or another compute tile.

The state machine 1160 controls write and read operations of the memory array 1100. In some embodiments, the state machine 1160 facilitates sequential gray addressing. The state machine 1160 includes four decoders: two binary to gray decoders 1180 and two gray to binary decoders 1190. The state machine 1160 may generate write requests for writing data into the databanks 1105 and read requests for reading data by the read MUX 1150. A write request or read request may include an address that is determined based on gray coding to minimize switching of address bits during write operations and read operations.

The state machine 1160 may send a read request to the read MUX 1150 for read data from a databank 1105. The read request may be temporarily stored in a flip-flop array 1165. The flip-flop array 1165 may include one or more flip-flops for storing the address. In an example, the flip-flop array 1165 includes six flip-flops for storing a six-bit address. The state machine 1160 may send a write request to the write decoder 1170 for writing data into a databank 1105. The write request may be temporarily stored in a flip-flop array 1175. The flip-flop array 1175 may include one or more flip-flops for storing the address. In an example, the flip-flop array 1175 includes six flip-flops for storing a six-bit address. The gray to binary decoder 1190, takes as input the write or read address requests sent out by state machine 1160 that it can advance to the next address to be written or read.

Example DNN Accelerator

Figure 12:
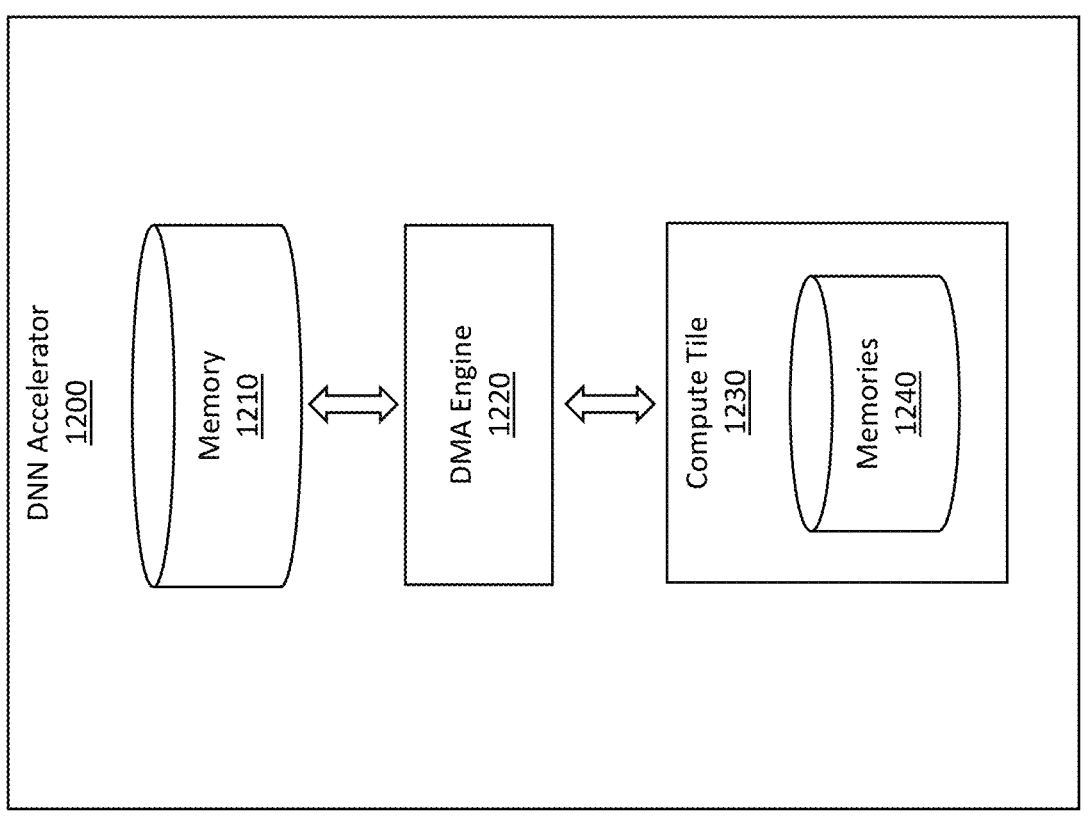
FIG. 12 illustrates a DNN accelerator, in accordance with various embodiments.

FIG. 12 is a block diagram of an example DNN accelerator 1200, in accordance with various embodiments. The DNN accelerator 1200 can run DNNs, e.g., the DNN 100 in FIG. 1. The DNN accelerator 1200 includes a memory 1210, a DMA (direct memory access) engine 1220, a compute tile 1230, and a memory 1240 inside the compute tile 1230. In other embodiments, alternative configurations, different or additional components may be included in the DNN accelerator 1200. For instance, the DNN accelerator 1200 may include more than one memory 1210 or 1240, more than one DMA engine 1220, or more than one compute tile 1230. Further, functionality attributed to a component of the DNN accelerator 1200 may be accomplished by a different component included in the DNN accelerator 1200 or by a different system.

The memory 1210 stores data to be used by the compute tile 1230 to perform deep learning operations in DNN models. Example deep learning operations include convolutions (also referred to as "convolutional operations"), pooling operations, elementwise operations, other types of deep learning operations, or some combination thereof. The memory 1210 may be a main memory of the DNN accelerator 1200. In some embodiments, the memory 1210 includes one or more DRAMs (dynamic random-access memory). For instance, the memory 1210 may store the input tensor, convolutional kernels, or output tensor of a convolution in a convolutional layer of a DNN, e.g., the convolutional layer 110. The output tensor can be transmitted from the memory 1240 to the memory 1210 through the DMA engine 1220.

In other embodiments, the input tensor or output tensor is not stored in the memory 1210. For instance, the input tensor may be directly transmitted from an internal memory of another MAC unit array to the memory 1240 in the compute tile 1230. The output tensor may be directly transmitted from the memory 1240 in the compute tile 1230 into an internal memory of another compute tile. The input tensor may be a 3D matrix and include $C_{in}$ input channels. Examples of the input tensor include the input tensor 140 in FIG. 1 or the input tensor 210 in FIG. 2. The output tensor may be a 3D matrix and include $C_{out}$ output channels. Examples of the output tensor include the output tensor 160 in FIG. 1 or the output tensor 200 in FIG. 2.

The DMA engine 1220 facilitates data transfer between the memory 1210 and the memory 1240. For example, the DMA engine 1220 can read data from the memory 1210 and write data into the memory 1240. As another example, the DMA engine 1220 can read data from the memory 1240 and write data into the memory 1210. The DMA engine 1220 provides a DMA feature that allows the compute tile 1230 to initiate data transfer between the memory 1210 and the memory 1240 and to perform other operations while the data transfer is in being conducted. In some embodiments, the DMA engine 1220 may read tensors from the memory 1210, modify the tensors in a way that is optimized for the compute tile 1230 before it writes the tensors into the memory 1240.

The compute tile 1230 performs computation for deep learning operations. The compute tile 1230 may run the operations in a DNN layer, or a portion of the operations in the DNN layer. An example of the compute tile 1230 is the compute block 300 in FIG. 3. In some embodiments, the operations of the DNN layers may be run by one or more other compute tiles in parallel with the compute tile 1230. The compute tile 1230 may perform convolutions, e.g., standard convolution or depthwise convolution. In some embodiments, the compute tile 1230 receive an input tensor and one or more convolutional kernels and performs a convolution with the input tensor and convolutional kernels. The result of the convolution may be an output tensor, which can be further computed, e.g., by another compute tile. The input tensor, convolutional kernels, or output tensor may be stored in the memory 1240.

The memory 1240 is local to the compute tile 1230. In the embodiments of FIG. 12, the memory 1240 is inside the compute tile 1230. In other embodiments, the memory 1240 may be outside the compute tile 1230. The memory 1240 and the compute tile 1230 can be implemented on the same chip. In some embodiments, the memory 1240 includes one or more SRAMs (static random-access memories). The memory 1240 may be register files. In some embodiments, the memory 1240 may also include one or more cache memories. The memory 1240 stores data used for or generated from convolutions, e.g., input tensors, kernels, and output tensors. An input tensor or kernel may be written into the memory 1240 by the DMA engine 1220. An output tensor may be loaded into the memory 1240 in the compute tile 1230. An embodiment of the memory 1240 includes the input memory array 310, weight memory array 320, and output memory array 330 in FIG. 3.

Example Deep Learning Environment

FIG. 13 illustrates a deep learning environment 1300, in accordance with various embodiments. The deep learning environment 1300 includes a deep learning server 1310 and a plurality of client devices 1320 (individually referred to as client device 1320). The deep learning server 1310 is connected to the client devices 1320 through a network 1330. In other embodiments, the deep learning environment 1300 may include fewer, more, or different components.

The deep learning server 1310 trains deep learning models using neural networks. A neural network is structured like the human brain and consists of artificial neurons, also known as nodes. These nodes are stacked next to each other in 3 types of layers: input layer, hidden layer(s), and output layer. Data provides each node with information in the form of inputs. The node multiplies the inputs with random weights, calculates them, and adds a bias. Finally, nonlinear functions, also known as activation functions, are applied to determine which neuron to fire. The deep learning server 1310 can use various types of neural networks, such as DNN, recurrent neural network (RNN), generative adversarial network (GAN), long short-term memory network (LSTMN), and so on. During the process of training the deep learning models, the neural networks use unknown elements in the input distribution to extract features, group objects, and discover useful data patterns. The deep learning models can be used to solve various problems, e.g., making predictions, classifying images, and so on. The deep learning server 1310 may build deep learning models specific to particular types of problems that need to be solved. A deep learning model is trained to receive an input and outputs the solution to the particular problem.

In FIG. 13, the deep learning server 1310 includes a DNN system 1340, a database 1350, and a distributer 1360. The DNN system 1340 trains DNNs. The DNNs can be used to process images, e.g., images captured by autonomous vehicles, medical devices, satellites, and so on. In an embodiment, a DNN receives an input image and outputs classifications of objects in the input image. An example of the DNNs is the DNN 100 described above in conjunction with FIG. 1. In some embodiments, the DNN system 1340 trains DNNs through knowledge distillation, e.g., dense-connection based knowledge distillation. The trained DNNs may be used on low memory systems, like mobile phones, IOT edge devices, and so on. An embodiment of the DNN system 1340 is the DNN accelerator 200 described above in conjunction with FIG. 2.

The database 1350 stores data received, used, generated, or otherwise associated with the deep learning server 1310. For example, the database 1350 stores a training dataset that the DNN system 1340 uses to train DNNs. In an embodiment, the training dataset is an image gallery that can be used to train a DNN for classifying images. The training dataset may include data received from the client devices 1320. As another example, the database 1350 stores hyperparameters of the neural networks built by the deep learning server 1310.

The distributer 1360 distributes deep learning models generated by the deep learning server 1310 to the client devices 1320. In some embodiments, the distributer 1360 receives a request for a DNN from a client device 1320 through the network 1330. The request may include a description of a problem that the client device 1320 needs to solve. The request may also include information of the client device 1320, such as information describing available computing resource on the client device. The information describing available computing resource on the client device 1320 can be information indicating network bandwidth, information indicating available memory size, information indicating processing power of the client device 1320, and so on. In an embodiment, the distributer may instruct the DNN system 1340 to generate a DNN in accordance with the request. The DNN system 1340 may generate a DNN based on the information in the request. For instance, the DNN system 1340 can determine the structure of the DNN and/or train the DNN in accordance with the request.

In another embodiment, the distributer 1360 may select the DNN from a group of pre-existing DNNs based on the request. The distributer 1360 may select a DNN for a particular client device 1320 based on the size of the DNN and available resources of the client device 1320. In embodiments where the distributer 1360 determines that the client device 1320 has limited memory or processing power, the distributer 1360 may select a compressed DNN for the client device 1320, as opposed to an uncompressed DNN that has a larger size. The distributer 1360 then transmits the DNN generated or selected for the client device 1320 to the client device 1320.

In some embodiments, the distributer 1360 may receive feedback from the client device 1320. For example, the distributer 1360 receives new training data from the client device 1320 and may send the new training data to the DNN system 1340 for further training the DNN. As another example, the feedback includes an update of the available computer resource on the client device 1320. The distributer 1360 may send a different DNN to the client device 1320 based on the update. For instance, after receiving the feedback indicating that the computing resources of the client device 1320 have been reduced, the distributer 1360 sends a DNN of a smaller size to the client device 1320.

The client devices 1320 receive DNNs from the distributer 1360 and applies the DNNs to perform machine learning tasks, e.g., to solve problems or answer questions. In various embodiments, the client devices 1320 input images into the DNNs and uses the output of the DNNs for various applications, e.g., visual reconstruction, augmented reality, robot localization and navigation, medical diagnosis, weather prediction, and so on. A client device 1320 may be one or more computing devices capable of receiving user input as well as transmitting and/or receiving data via the network 1330. In one embodiment, a client device 1320 is a conventional computer system, such as a desktop or a laptop computer. Alternatively, a client device 1320 may be a device having computer functionality, such as a personal digital assistant (PDA), a mobile telephone, a smartphone, an autonomous vehicle, or another suitable device. A client device 1320 is configured to communicate via the network 1330. In one embodiment, a client device 1320 executes an application allowing a user of the client device 1320 to interact with the deep learning server 1310 (e.g., the distributer 1360 of the deep learning server 1310). The client device 1320 may request DNNs or send feedback to the distributer 1360 through the application. For example, a client device 1320 executes a browser application to enable interaction between the client device 1320 and the deep learning server 1310 via the network 1330. In another embodiment, a client device 1320 interacts with the deep learning server 1310 through an application programming interface (API) running on a native operating system of the client device 1320, such as IOS® or ANDROID™.

In an embodiment, a client device 1320 is an integrated computing device that operates as a standalone network-enabled device. For example, the client device 1320 includes display, speakers, microphone, camera, and input device. In another embodiment, a client device 1320 is a computing device for coupling to an external media device such as a television or other external display and/or audio output system. In this embodiment, the client device 1320 may couple to the external media device via a wireless interface or wired interface (e.g., an HDMI (High-Definition Multimedia Interface) cable) and may utilize various functions of the external media device such as its display, speakers, microphone, camera, and input devices. Here, the client device 1320 may be configured to be compatible with a generic external media device that does not have specialized software, firmware, or hardware specifically for interacting with the client device 1320.

The network 1330 supports communications between the deep learning server 1310 and client devices 1320. The network 1330 may comprise any combination of local area and/or wide area networks, using both wired and/or wireless communication systems. In one embodiment, the network

1330 may use standard communications technologies and/or protocols. For example, the network 1330 may include communication links using technologies such as Ethernet, 13010.11, worldwide interoperability for microwave access (WiMAX), 3G, 4G, code division multiple access (CDMA), digital subscriber line (DSL), etc. Examples of networking protocols used for communicating via the network 1330 may include multiprotocol label switching (MPLS), transmission control protocol/Internet protocol (TCP/IP), hypertext transport protocol (HTTP), simple mail transfer protocol (SMTP), and file transfer protocol (FTP). Data exchanged over the network 1330 may be represented using any suitable format, such as hypertext markup language (HTML) or extensible markup language (XML). In some embodiments, all or some of the communication links of the network 1330 may be encrypted using any suitable technique or techniques.

Example DNN System

Figure 14:
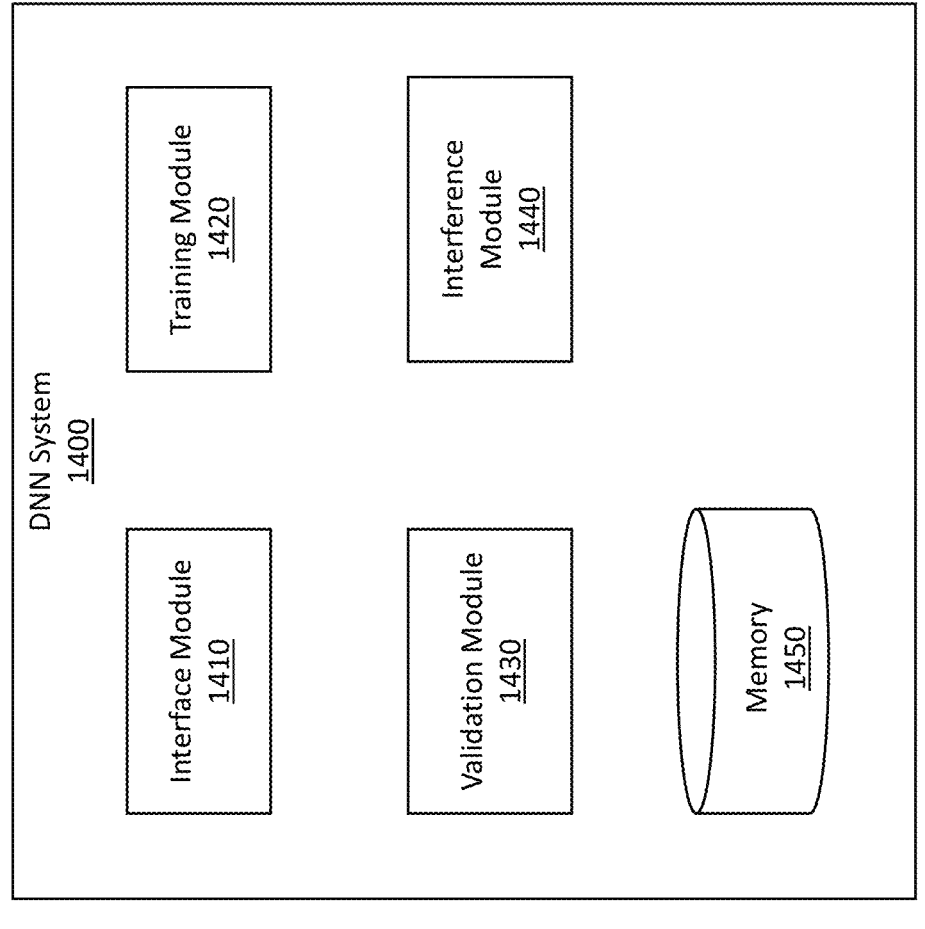
FIG. 14 is a block diagram of an example DNN system, in accordance with various embodiments.

FIG. 14 is a block diagram of an example DNN system 1400, in accordance with various embodiments. The whole DNN system 1400 or a part of the DNN system 1400 may be implemented in the computing device 1400 in FIG. 14. The DNN system 1400 trains DNNs for various tasks, such as image classification, learning relationships between biological cells (e.g., DNA, proteins, etc.), control behaviors for devices (e.g., robots, machines, etc.), and so on. The DNN system 1400 includes an interface module 1410, a training module 1420, a validation module 1430, an inference module 1440, and a memory 1450. In other embodiments, alternative configurations, different or additional components may be included in the DNN system 1400. Further, functionality attributed to a component of the DNN system 1400 may be accomplished by a different component included in the DNN system 1400 or a different system. The DNN system 1400 or a component of the DNN system 1400 (e.g., the training module 1420 or inference module 1440) may include the computing device 1400.

The interface module 1410 facilitates communications of the DNN system 1400 with other systems. For example, the interface module 1410 establishes communications between the DNN system 1400 with an external database to receive data that can be used to train DNNs or input into DNNs to perform tasks. As another example, the interface module 1410 supports the DNN system 1400 to distribute DNNs to other systems, e.g., computing devices configured to apply DNNs to perform tasks.

The training module 1420 trains DNNs by using a training dataset. The training module 1420 forms the training dataset. In an embodiment where the training module 1420 trains an DNN to recognize objects in images, the training dataset includes training images and training labels. The training labels describe ground-truth classifications of objects in the training images. In some embodiments, each label in the training dataset corresponds to an object in a training image. In some embodiments, a part of the training dataset may be used to initially train the DNN, and the rest of the training dataset may be held back as a validation subset used by the validation module 1430 to validate performance of a trained DNN. The portion of the training dataset not including the tuning subset and the validation subset may be used to train the DNN.

The training module 1420 also determines hyperparameters for training the DNN. Hyperparameters are variables specifying the DNN training process. Hyperparameters are different from parameters inside the DNN (e.g., weights of filters). In some embodiments, hyperparameters include variables determining the architecture of the DNN, such as number of hidden layers, etc. Hyperparameters also include variables which determine how the DNN is trained, such as batch size, number of epochs, etc. A batch size defines the number of training samples to work through before updating the parameters of the DNN. The batch size is the same as or smaller than the number of samples in the training dataset. The training dataset can be divided into one or more batches. The number of epochs defines how many times the entire training dataset is passed forward and backwards through the entire network. The number of epochs defines the number of times that the deep learning algorithm works through the entire training dataset. One epoch means that each training sample in the training dataset has had an opportunity to update the parameters inside the DNN. An epoch may include one or more batches. The number of epochs may be 14, 140, 500, 1400, or even larger.

The training module 1420 defines the architecture of the DNN, e.g., based on some of the hyperparameters. The architecture of the DNN includes an input layer, an output layer, and a plurality of hidden layers. The input layer of an DNN may include tensors (e.g., a multidimensional array) specifying attributes of the input image, such as the height of the input image, the width of the input image, and the depth of the input image (e.g., the number of bits specifying the color of a pixel in the input image). The output layer includes labels of objects in the input layer. The hidden layers are layers between the input layer and output layer. The hidden layers include one or more convolutional layers and one or more other types of layers, such as pooling layers, fully connected layers, normalization layers, softmax or logistic layers, and so on. The convolutional layers of the DNN abstract the input image to a feature map that is represented by a tensor specifying the feature map height, the feature map width, and the feature map channels (e.g., red, green, blue images include 3 channels). A pooling layer is used to reduce the spatial volume of input image after convolution. It is used between 2 convolution layers. A fully connected layer involves weights, biases, and neurons. It connects neurons in one layer to neurons in another layer. It is used to classify images between different category by training.

In the process of defining the architecture of the DNN, the training module 1420 also adds an activation function to a hidden layer or the output layer. An activation function of a layer transforms the weighted sum of the input of the layer to an output of the layer. The activation function may be, for example, a rectified linear unit activation function, a tangent activation function, or other types of activation functions.

After the training module 1420 defines the architecture of the DNN, the training module 1420 inputs a training dataset into the DNN. The training dataset includes a plurality of training samples. An example of a training sample includes an object in an image and a ground-truth label of the object. The training module 1420 modifies the parameters inside the DNN ("internal parameters of the DNN") to minimize the error between labels of the training objects that are generated by the DNN and the ground-truth labels of the objects. The internal parameters include weights of filters in the convolutional layers of the DNN. In some embodiments, the training module 1420 uses a cost function to minimize the error.

The training module 1420 may train the DNN for a predetermined number of epochs. The number of epochs is a hyperparameter that defines the number of times that the deep learning algorithm will work through the entire training dataset. One epoch means that each sample in the training dataset has had an opportunity to update internal parameters of the DNN. After the training module 1420 finishes the predetermined number of epochs, the training module 1420 may stop updating the parameters in the DNN. The DNN having the updated parameters is referred to as a trained DNN.

The validation module 1430 verifies accuracy of trained DNNs. In some embodiments, the validation module 1430 inputs samples in a validation dataset into a trained DNN and uses the outputs of the DNN to determine the model accuracy. In some embodiments, a validation dataset may be formed of some or all the samples in the training dataset. Additionally or alternatively, the validation dataset includes additional samples, other than those in the training sets. In some embodiments, the validation module 1430 determines may determine an accuracy score measuring the precision, recall, or a combination of precision and recall of the DNN. The validation module 1430 may use the following metrics to determine the accuracy score: Precision=TP/(TP+FP) and Recall=TP/(TP+FN), where precision may be how many the reference classification model correctly predicted (TP or true positives) out of the total it predicted (TP+FP or false positives), and recall may be how many the reference classification model correctly predicted (TP) out of the total number of objects that did have the property in question (TP+FN or false negatives). The F-score (F-score=2*PR/(P+R)) unifies precision and recall into a single measure.

The validation module 1430 may compare the accuracy score with a threshold score. In an example where the validation module 1430 determines that the accuracy score of the augmented model is lower than the threshold score, the validation module 1430 instructs the training module 1420 to re-train the DNN. In one embodiment, the training module 1420 may iteratively re-train the DNN until the occurrence of a stopping condition, such as the accuracy measurement indication that the DNN may be sufficiently accurate, or a number of training rounds having taken place.

The inference module 1440 applies the trained or validated DNN to perform tasks. For instance, the inference module 1440 inputs images into the DNN. The DNN outputs classifications of objects in the images. As an example, the DNN may be provisioned in a security setting to detect malicious or hazardous objects in images captured by security cameras. As another example, the DNN may be provisioned to detect objects (e.g., road signs, hazards, humans, pets, etc.) in images captured by cameras of an autonomous vehicle. The input to the DNN may be formatted according to a predefined input structure mirroring the way that the training dataset was provided to the DNN. The DNN may generate an output structure which may be, for example, a classification of the image, a listing of detected objects, a boundary of detected objects, or the like. In some embodiments, the inference module 1440 distributes the DNN to other systems, e.g., computing devices in communication with the DNN system 1400, for the other systems to apply the DNN to perform the tasks.

The memory 1450 stores data received, generated, used, or otherwise associated with the DNN system 1400. For example, the memory 1450 stores the datasets used by the training module 1420 and validation module 1430. The memory 1450 may also store data generated by the training module 1420 and validation module 1430, such as the hyperparameters for training DNNs, internal parameters of trained DNNs (e.g., values of tunable parameters of FALUs), etc. In the embodiment of FIG. 14, the memory 1450 is a component of the DNN system 1400. In other embodiments, the memory 1450 may be external to the DNN system 1400 and communicate with the DNN system 1400 through a network.

Example Computing Device

Figure 15:
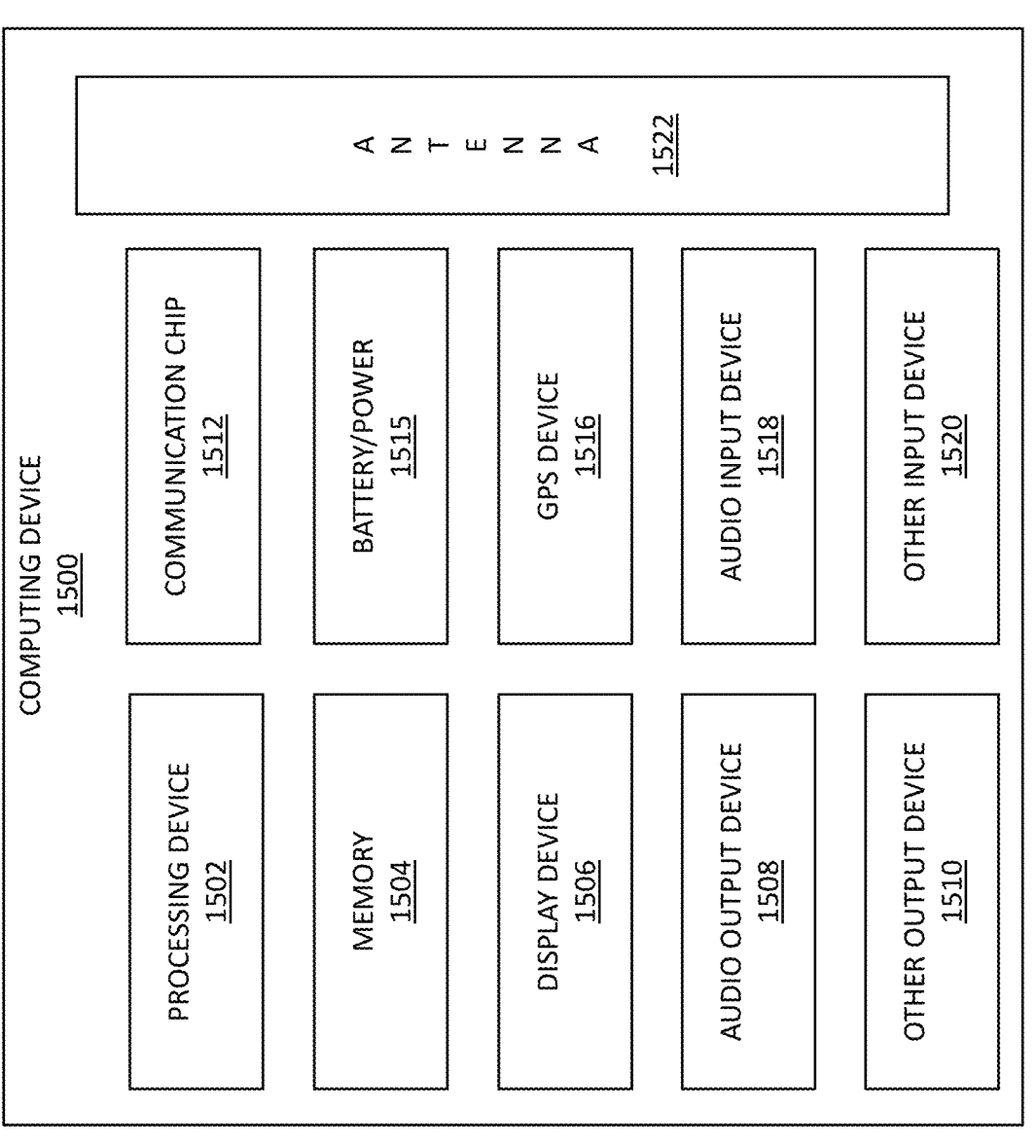
FIG. 15 is a block diagram of an example computing device, in accordance with various embodiments.

FIG. 15 is a block diagram of an example computing device 1500, in accordance with various embodiments. In some embodiments, the computing device 1500 can be used as the DNN system 1400 in FIG. 14. A number of components are illustrated in FIG. 15 as included in the computing device 1500, but any one or more of these components may be omitted or duplicated, as suitable for the application. In some embodiments, some or all of the components included in the computing device 1500 may be attached to one or more motherboards. In some embodiments, some or all of these components are fabricated onto a single system on a chip (SoC) die. Additionally, in various embodiments, the computing device 1500 may not include one or more of the components illustrated in FIG. 15, but the computing device 1500 may include interface circuitry for coupling to the one or more components. For example, the computing device 1500 may not include a display device 1506, but may include display device interface circuitry (e.g., a connector and driver circuitry) to which a display device 1506 may be coupled. In another set of examples, the computing device 1500 may not include an audio input device 1518 or an audio output device 1508, but may include audio input or output device interface circuitry (e.g., connectors and supporting circuitry) to which an audio input device 1518 or audio output device 1508 may be coupled.

The computing device 1500 may include a processing device 1502 (e.g., one or more processing devices). The processing device 1502 processes electronic data from registers and/or memory to transform that electronic data into other electronic data that may be stored in registers and/or memory. The computing device 1500 may include a memory 1504, which may itself include one or more memory devices such as volatile memory (e.g., DRAM), nonvolatile memory (e.g., read-only memory (ROM)), high bandwidth memory (HBM), flash memory, solid state memory, and/or a hard drive. In some embodiments, the memory 1504 may include memory that shares a die with the processing device 1502. In some embodiments, the memory 1504 includes one or more non-transitory computer-readable media storing instructions executable to perform operations for deep learning. The instructions stored in the one or more non-transitory computer-readable media may be executed by the processing device 2402.

In some embodiments, the computing device 1500 may include a communication chip 1512 (e.g., one or more communication chips). For example, the communication chip 1512 may be configured for managing wireless communications for the transfer of data to and from the computing device 1500. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1512 may implement any of a number of wireless standards or protocols, including but not limited to Institute for Electrical and Electronic Engineers (IEEE) standards including Wi-Fi (IEEE 802.10 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for worldwide interoperability for microwave access, which is a certification mark for products that pass conformity and interoperability tests for the IEEE 802.16 standards. The communication chip 1512 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1512 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1512 may operate in accordance with CDMA, Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1512 may operate in accordance with other wireless protocols in other embodiments. The computing device 1500 may include an antenna 1522 to facilitate wireless communications and/or to receive other wireless communications (such as AM or FM radio transmissions).

In some embodiments, the communication chip 1512 may manage wired communications, such as electrical, optical, or any other suitable communication protocols (e.g., the Ethernet). As noted above, the communication chip 1512 may include multiple communication chips. For instance, a first communication chip 1512 may be dedicated to shorter-range wireless communications such as Wi-Fi or Bluetooth, and a second communication chip 1512 may be dedicated to longer-range wireless communications such as global positioning system (GPS), EDGE, GPRS, CDMA, WiMAX, LTE, EV-DO, or others. In some embodiments, a first communication chip 1512 may be dedicated to wireless communications, and a second communication chip 1512 may be dedicated to wired communications.

The computing device 1500 may include battery/power circuitry 1514. The battery/power circuitry 1514 may include one or more energy storage devices (e.g., batteries or capacitors) and/or circuitry for coupling components of the computing device 1500 to an energy source separate from the computing device 1500 (e.g., AC line power).

The computing device 1500 may include a display device 1506 (or corresponding interface circuitry, as discussed above). The display device 1506 may include any visual indicators, such as a heads-up display, a computer monitor, a projector, a touchscreen display, a liquid crystal display (LCD), a light-emitting diode display, or a flat panel display, for example.

The computing device 1500 may include an audio output device 1508 (or corresponding interface circuitry, as discussed above). The audio output device 1508 may include any device that generates an audible indicator, such as speakers, headsets, or earbuds, for example.

The computing device 1500 may include an audio input device 1518 (or corresponding interface circuitry, as discussed above). The audio input device 1518 may include any device that generates a signal representative of a sound, such as microphones, microphone arrays, or digital instruments (e.g., instruments having a musical instrument digital interface (MIDI) output).

The computing device 1500 may include a GPS device 1516 (or corresponding interface circuitry, as discussed above). The GPS device 1516 may be in communication with a satellite-based system and may receive a location of the computing device 1500, as known in the art.

The computing device 1500 may include an other output device 1510 (or corresponding interface circuitry, as discussed above). Examples of the other output device 1510 may include an audio codec, a video codec, a printer, a wired or wireless transmitter for providing information to other devices, or an additional storage device.

The computing device 1500 may include an other input device 1520 (or corresponding interface circuitry, as discussed above). Examples of the other input device 1520 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (register fileID) reader.

The computing device 1500 may have any desired form factor, such as a handheld or mobile computer system (e.g., a cell phone, a smart phone, a mobile internet device, a music player, a tablet computer, a laptop computer, a netbook computer, an ultrabook computer, a PDA, an ultramobile personal computer, etc.), a desktop computer system, a server or other networked computing component, a printer, a scanner, a monitor, a set-top box, an entertainment control unit, a vehicle control unit, a digital camera, a digital video recorder, or a wearable computer system. In some embodiments, the computing device 1500 may be any other electronic device that processes data.

Select Examples

The following paragraphs provide various examples of the embodiments disclosed herein.

Example 1 provides a memory for deep learning, the memory including a first databank, including a plurality of first flip-flop arrays, each first flip-flop array including a plurality of flip-flops for storing data, and a plurality of first logic gates for gating the plurality of first flip-flop arrays, each first logic gate coupled to a different one of the plurality of first flip-flop arrays; and a second databank, including a plurality of second flip-flop arrays, each second flip-flop array including a plurality of flip-flops for storing data, and a plurality of second logic gates for gating the plurality of second flip-flop arrays, each second logic gate coupled to a different one of the plurality of second flip-flop arrays, where the plurality of first logic gates and the plurality of second logic gates are configured to prevent data from being written into the first databank and the second databank at a same time.

Example 2 provides the memory of example 1, where a plurality of bytes is written into the first databank, and bits from different one of the plurality of bytes are written into the plurality of flip-flops.

Example 3 provides the memory of example 2, where the bits have a same position in the plurality of bytes.

Example 4 provides the memory of any of the preceding examples, where the first databank is coupled to a first multiplexer and a plurality of second multiplexers, the plurality of first flip-flop arrays is configured to store a plurality of bytes, each byte stored in a different one of the plurality of first flip-flop arrays, the first multiplexer is configured to read the plurality of bytes from the plurality of first flip-flop arrays, and the plurality of second multiplexers is configured to read bits in the plurality of bytes from the first multiplexer.

Example 5 provides the memory of example 4, where a second multiplexer includes a third multiplexer and a fourth multiplexer, the third multiplexer is configured to read the bits in the plurality of bytes based on a first portion of a memory address of each of the plurality of bytes, and the fourth multiplexer is configured to read the bits in the plurality of bytes based on a second portion of a memory address of each of the plurality of bytes.

Example 6 provides the memory of example 5, where the first portion includes a first bit in the memory address, the second portion includes a second bit in the memory address, and changes in the first bit is less frequent than changes in the second bit in a process of reading the bits in the plurality of bytes by the second multiplexer.

Example 7 provides the memory of any one of examples 4-6, where the first multiplexer or the second multiplexer is configured to read based on a sequence of addresses, and an order of the sequence of addresses is determined based on gray codes so that two adjacent addresses in the sequence are different by one bit.

Example 8 provides the memory of any of the preceding examples, where the first databank or the second databank is coupled to a data line, the data line provides a path for writing data into the first databank or the second databank, the data line includes a plurality of wires, each wire corresponding to an address in the first databank or the second databank, and the plurality of wires is arranged in an order determined based on gray codes so that two addresses corresponding two wires arranged adjacently are different by one bit.

Example 9 provides the memory of any of the preceding examples, where the first databank or the second databank is configured to store a vector to be used in a multiple-accumulate operation in a DNN.

Example 10 provides the memory of example 9, where the vector is a portion of an input tensor or of a filter for a convolutional layer in the DNN.

Example 11 provides a compute block, including an array of PEs, the PEs configured to perform MAC operations; and a memory coupled to the array of PEs and configured to store data used for the MAC operations, including a first databank, including a plurality of first flip-flop arrays, each first flip-flop array including a plurality of first flip-flops, and a plurality of first logic gates for gating the plurality of first flip-flop arrays, each first logic gate coupled to a different one of the plurality of first flip-flop arrays, and a second databank, including a plurality of second flip-flop arrays, each second flip-flop array including a plurality of second flip-flops, and a plurality of second logic gates for gating the plurality of second flip-flop arrays, each second logic gate coupled to a different one of the plurality of second flip-flop arrays, where the plurality of first logic gates and the plurality of second logic gates are configured to prevent data from being written into the first databank and the second databank at a same time.

Example 12 provides the compute block of example 11, where a plurality of bytes is written into the first databank, and bits from different ones of the plurality of bytes are written into the plurality of first flip-flops.

Example 13 provides the compute block of example 12, where the bits have a same position in the plurality of bytes.

Example 14 provides the compute block of any one of examples 11-13, where the first databank is coupled to a first multiplexer and a plurality of second multiplexers, the plurality of first flip-flop arrays is configured to store a plurality of bytes, each byte stored in a different one of the plurality of first flip-flop arrays, the first multiplexer is configured to read the plurality of bytes from the plurality of first flip-flop arrays, and the plurality of second multiplexers is configured to read bits in the plurality of bytes from the first multiplexer.

Example 15 provides the compute block of example 14, where a second multiplexer includes a third multiplexer and a fourth multiplexer, the third multiplexer is configured to read the bits in the plurality of bytes based on a first portion of a memory address of each of the plurality of bytes, and the fourth multiplexer is configured to read the bits in the plurality of bytes based on a second portion of a memory address of each of the plurality of bytes.

Example 16 provides the compute block of example 15, where the first portion includes a first bit in the memory address, the second portion includes a second bit in the memory address, and changes in the first bit is less frequent than changes in the second bit in a process of reading the bits in the plurality of bytes by the second multiplexer.

Example 17 provides the compute block of any one of examples 14-16, where the first multiplexer or the second multiplexer is configured to read based on a sequence of addresses, and an order of the sequence of addresses is determined based on gray codes so that two adjacent addresses in the sequence are different by one bit.

Example 18 provides the compute block of any one of examples 11-17, where the first databank or the second databank is coupled to a data line, the data line provides a path for writing data into the first databank or the second databank, the data line includes a plurality of wires, each wire corresponding to an address in the first databank or the second databank, and the plurality of wires is arranged in an order determined based on gray codes so that two addresses corresponding two wires arranged adjacently are different by one bit.

Example 19 provides the compute block of any one of examples 11-18, where the first databank is configured to store a first vector to be used in an MAC operation by a first PE in the array of PEs, and the first databank is configured to store a second vector to be used in another MAC operation by a second PE in the array of PEs.

Example 20 provides the compute block of any one of examples 11-19, where the first vector is a portion of an input tensor or a portion of a filter for a convolution performed by the array of PEs.

Example 21 provides a compute block for executing a convolution in a DNN, including an array of PEs, the PEs configured to perform MAC operations in the convolution; a first memory coupled to the array of PEs and configured to store an input tensor of the convolution; and a second memory coupled to the array of PEs and configured to store one or more filters of the convolution, the first memory or the second memory including a first databank, including a plurality of first logic gates and a plurality of first flip-flop arrays, where a first flip-flop array including a plurality of first flip-flops and coupled to one of the plurality of first logic gates, and a second databank, including a plurality of second logic gates and a plurality of second flip-flop arrays, where a second flip-flop array including a plurality of second flip-flops and coupled to one of the plurality of second logic gates, where the plurality of first logic gates and the plurality of second logic gates are configured to prevent data from being written into the first databank and the second databank at a same time.

Example 22 provides the compute block of example 21, where a plurality of bytes is written into the first databank, and bits from different ones of the plurality of bytes are written into the plurality of first flip-flops.

Example 23 provides the compute block of example 21 or 22, where the first databank is coupled to a first multiplexer and a plurality of second multiplexers, the plurality of first flip-flop arrays is configured to store a plurality of bytes, each byte stored in a different one of the plurality of first flip-flop arrays, the first multiplexer is configured to read the plurality of bytes from the plurality of first flip-flop arrays, and the plurality of second multiplexers is configured to read bits in the plurality of bytes from the first multiplexer.

Example 24 provides the compute block of example 23, where a second multiplexer includes a third multiplexer and a fourth multiplexer, the third multiplexer is configured to read the bits in the plurality of bytes based on a first portion of a memory address of each of the plurality of bytes, and the fourth multiplexer is configured to read the bits in the plurality of bytes based on a second portion of a memory address of each of the plurality of bytes.

Example 25 provides the compute block of example 23 or 24, where the first multiplexer or the second multiplexer is configured to read based on a sequence of addresses, and an order of the sequence of addresses is determined based on gray codes so that two adjacent addresses in the sequence are different by one bit.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize. These modifications may be made to the disclosure in light of the above detailed description.

The invention claimed is:

1. A memory for deep learning, the memory comprising:
a first databank, comprising:
    a plurality of first flip-flop arrays, each first flip-flop array comprising a plurality of first flip-flops for storing data, and
    a plurality of first logic gates for gating the plurality of first flip-flop arrays, each first logic gate coupled to a different one of the plurality of first flip-flop arrays; and
a second databank, comprising:
    a plurality of second flip-flop arrays, each second flip-flop array comprising a plurality of second flip-flops for storing data, and
    a plurality of second logic gates for gating the plurality of second flip-flop arrays, each second logic gate coupled to a different one of the plurality of second flip-flop arrays,
wherein the plurality of first logic gates and the plurality of second logic gates are configured to prevent data from being written into the first databank and the second databank at a same time.

2. The memory of claim 1, wherein a plurality of bytes is written into the first databank, and bits from different ones of the plurality of bytes are written into the plurality of first flip-flops.

3. The memory of claim 2, wherein the bits have a same position in the plurality of bytes.

4. The memory of claim 1, wherein:
the first databank is coupled to a first multiplexer and a plurality of second multiplexers,
the plurality of first flip-flop arrays is configured to store a plurality of bytes, each byte stored in a different one of the plurality of first flip-flop arrays, the first multiplexer is configured to read the plurality of bytes from the plurality of first flip-flop arrays, and the plurality of second multiplexers is configured to read bits in the plurality of bytes from the first multiplexer.

5. The memory of claim 4, wherein:
a second multiplexer comprises a third multiplexer and a fourth multiplexer,
the third multiplexer is configured to read the bits in the plurality of bytes based on a first portion of a memory address of each of the plurality of bytes, and
the fourth multiplexer is configured to read the bits in the plurality of bytes based on a second portion of a memory address of each of the plurality of bytes.

6. The memory of claim 5, wherein the first portion comprises a first bit in the memory address, the second portion comprises a second bit in the memory address, and changes in the first bit is less frequent than changes in the second bit in a process of reading the bits in the plurality of bytes by the second multiplexer.

7. The memory of claim 4, wherein the first multiplexer or the second multiplexer is configured to read based on a sequence of addresses, and an order of the sequence of addresses is determined based on gray codes so that two adjacent addresses in the sequence are different by one bit.

8. The memory of claim 1, wherein:
the first databank or the second databank is coupled to a data line,
the data line provides a path for writing data into the first databank or the second databank,
the data line comprises a plurality of wires, each wire corresponding to an address in the first databank or the second databank, and
the plurality of wires is arranged in an order determined based on gray codes so that two addresses corresponding two wires arranged adjacently are different by one bit.

9. The memory of claim 1, wherein the first databank or the second databank is configured to store a vector to be used in a multiple-accumulate operation in a deep neural network (DNN).

10. The memory of claim 9, wherein the vector is a portion of an input tensor or of a filter for a convolutional layer in the DNN.

11. A compute block, comprising:
an array of processing elements, the processing elements configured to perform multiply-accumulate (MAC) operations; and
a memory coupled to the array of processing elements and configured to store data used for the MAC operations, comprising:
a first databank, comprising:
a plurality of first flip-flop arrays, each first flip-flop array comprising a plurality of first flip-flops, and
a plurality of first logic gates for gating the plurality of first flip-flop arrays, each first logic gate coupled to a different one of the plurality of first flip-flop arrays, and
a second databank, comprising:
a plurality of second flip-flop arrays, each second flip-flop array comprising a plurality of second flip-flops, and
a plurality of second logic gates for gating the plurality of second flip-flop arrays, each second logic gate coupled to a different one of the plurality of second flip-flop arrays,
wherein the plurality of first logic gates and the plurality of second logic gates are configured to prevent data from being written into the first databank and the second databank at a same time.

12. The compute block of claim 11, wherein a plurality of bytes is written into the first databank, and bits from different ones of the plurality of bytes are written into the plurality of first flip-flops.

13. The compute block of claim 12, wherein the bits have a same position in the plurality of bytes.

14. The compute block of claim 11, wherein:
the first databank is coupled to a first multiplexer and a plurality of second multiplexers,
the plurality of first flip-flop arrays is configured to store a plurality of bytes, each byte stored in a different one of the plurality of first flip-flop arrays,
the first multiplexer is configured to read the plurality of bytes from the plurality of first flip-flop arrays, and
the plurality of second multiplexers is configured to read bits in the plurality of bytes from the first multiplexer.

15. The compute block of claim 14, wherein:
a second multiplexer comprises a third multiplexer and a fourth multiplexer,
the third multiplexer is configured to read the bits in the plurality of bytes based on a first portion of a memory address of each of the plurality of bytes, and
the fourth multiplexer is configured to read the bits in the plurality of bytes based on a second portion of a memory address of each of the plurality of bytes.

16. The compute block of claim 15, wherein the first portion comprises a first bit in the memory address, the second portion comprises a second bit in the memory address, and changes in the first bit is less frequent than changes in the second bit in a process of reading the bits in the plurality of bytes by the second multiplexer.

17. The compute block of claim 14, wherein the first multiplexer or the second multiplexer is configured to read based on a sequence of addresses, and an order of the sequence of addresses is determined based on gray codes so that two adjacent addresses in the sequence are different by one bit.

18. The compute block of claim 11, wherein:
the first databank or the second databank is coupled to a data line,
the data line provides a path for writing data into the first databank or the second databank,
the data line comprises a plurality of wires, each wire corresponding to an address in the first databank or the second databank, and
the plurality of wires is arranged in an order determined based on gray codes so that two addresses corresponding two wires arranged adjacently are different by one bit.

19. The compute block of claim 11, wherein the first databank is configured to store a first vector to be used in an MAC operation by a first processing element in the array of processing elements, and the first databank is configured to store a second vector to be used in another MAC operation by a second processing element in the array of processing elements.

20. The compute block of claim 19, wherein the first vector is a portion of an input tensor or a portion of a filter for a convolution performed by the array of processing elements.

21. A compute block for executing a convolution in a deep neural network (DNN), comprising:
an array of processing elements, the processing elements configured to perform multiply-accumulate (MAC) operations in the convolution;

a first memory coupled to the array of processing elements and configured to store an input tensor of the convolution; and a second memory coupled to the array of processing elements and configured to store one or more filters of the convolution, the first memory or the second memory comprising:

a first databank, comprising a plurality of first logic gates and a plurality of first flip-flop arrays, where a first flip-flop array comprising a plurality of first flip-flops and coupled to one of the plurality of first logic gates, and a second databank, comprising a plurality of second logic gates and a plurality of second flip-flop arrays, where a second flip-flop array comprising a plurality of second flip-flops and coupled to one of the plurality of second logic gates, wherein the plurality of first logic gates and the plurality of second logic gates are configured to prevent data from being written into the first databank and the second databank at a same time.

22. The compute block of claim 21, wherein a plurality of bytes is written into the first databank, and bits from different ones of the plurality of bytes are written into the plurality of first flip-flops.

23. The compute block of claim 21, wherein:

the first databank is coupled to a first multiplexer and a plurality of second multiplexers, the plurality of first flip-flop arrays is configured to store a plurality of bytes, each byte stored in a different one of the plurality of first flip-flop arrays, the first multiplexer is configured to read the plurality of bytes from the plurality of first flip-flop arrays, and the plurality of second multiplexers is configured to read bits in the plurality of bytes from the first multiplexer.

24. The compute block of claim 23, wherein:

a second multiplexer comprises a third multiplexer and a fourth multiplexer, the third multiplexer is configured to read the bits in the plurality of bytes based on a first portion of a memory address of each of the plurality of bytes, and the fourth multiplexer is configured to read the bits in the plurality of bytes based on a second portion of a memory address of each of the plurality of bytes.

25. The compute block of claim 23, wherein the first multiplexer or the second multiplexer is configured to read based on a sequence of addresses, and an order of the sequence of addresses is determined based on gray codes so that two adjacent addresses in the sequence are different by one bit.

\* \* \* \* \*